(12) United States Patent
Harada et al.

(10) Patent No.: US 8,084,352 B2
(45) Date of Patent: Dec. 27, 2011

(54) METHOD OF MANUFACTURING SEMICONDUCTOR DEVICE

(75) Inventors: Takeshi Harada, Shiga (JP); Junichi Shibata, Hyogo (JP); Akira Ueki, Osaka (JP)

(73) Assignee: Panasonic Corporation, Osaka (JP)

( * ) Notice: Subject to any disclaimer, the term of this patent is extended or adjusted under 35 U.S.C. 154(b) by 663 days.

(21) Appl. No.: 12/131,968

(22) Filed: Jun. 3, 2008

(65) Prior Publication Data
US 2008/0299758 A1 Dec. 4, 2008

(30) Foreign Application Priority Data

Jun. 4, 2007 (JP) ................................ 2007-148401
Mar. 21, 2008 (JP) ................................ 2008-072707

(51) Int. Cl.
*H01L 21/4763* (2006.01)
(52) U.S. Cl. ........ 438/619; 438/637; 438/687; 438/737; 257/E21.581; 257/E21.577; 257/E21.585

(58) Field of Classification Search .................. 438/421, 438/619, 637, 687, 737; 257/E21.573, E21.581, 257/E21.577, E21.585
See application file for complete search history.

(56) References Cited

U.S. PATENT DOCUMENTS

| 6,509,623 | B2 * | 1/2003 | Zhao | ............................. 257/522 |
| 7,741,228 | B2 * | 6/2010 | Ueki et al. | ..................... 438/736 |
| 2006/0088975 | A1 * | 4/2006 | Ueda | ............................ 438/421 |

FOREIGN PATENT DOCUMENTS

JP 2006-120988 5/2006
* cited by examiner

*Primary Examiner* — Mary Wilczewski
*Assistant Examiner* — Toniae Thomas
(74) *Attorney, Agent, or Firm* — Steptoe & Johnson LLP

(57) ABSTRACT

A high-density N-type diffusion layer 116 formed in a separation area 115 makes it possible to reduce a collector current flowing through a parasitic NPN transistor 102. Thus, a normal CMOS process can be used to provide a driving circuit and a data line driver which make it possible to improve resistance to possible noise occurring between adjacent terminals, while controlling a chip size.

8 Claims, 17 Drawing Sheets

METHOD OF MANUFACTURING SEMICONDUCTOR DEVICE

FIELD OF THE INVENTION

The present invention relates to a method of manufacturing a semiconductor device comprising an air gap structure that reduces capacity between wires.

BACKGROUND OF THE INVENTION

In recent years, miniaturization of semiconductor integrated circuit elements has reduced the intervals between elements and between wires internally connecting the elements together. This has disadvantageously increased the capacity between the wires to reduce a speed at which signals are propagated. Thus, examinations have been conducted of a method of forming an air gap between the wires to reduce the capacity. With reference to FIGS. 16A, 16B, 16C, 16D, 16E, 17A, 17B, 17C, and 17D, description will be given of a conventional method of manufacturing a semiconductor device having the air gap formed therein.

FIGS. 16A, 16B, 16C, 16D, 16E, 17A, 17B, 17C, and 17D are sectional views illustrating steps of the conventional method of manufacturing the semiconductor device.

First, as shown in FIG. 16A, an interlayer insulating film 2 and an inter-wire insulating film 3 are deposited on a surface of a semiconductor substrate 1. Wiring grooves 4 are formed in an upper part of a film stack of the interlayer insulating film 2 and the inter-wire insulating film 3 by photolithography and dry etching.

Then, as shown in FIG. 16B, a barrier film 5 and a Cu film 6 are sequentially deposited on the inter-wire insulating film 3 and inside the wiring grooves 4. Parts of the barrier film 5 and Cu film 6 which stick out from the wiring grooves 4 are then removed by CMP to form lower wires 7.

Then, as shown in FIG. 16C, a cap film 8 is selectively grown on surfaces of the lower wires 7.

Then, as shown in FIG. 16D, a resist pattern 9 is formed at a predetermined position on surfaces of the inter-wire insulating film 3 and the cap film 8. The purpose of formation of the resist pattern 9 will be described below in detail.

Then, as shown in FIG. 16E, the interlayer insulating film 2 and the inter-wire insulating film 3 are partly etched through the cap film 8 and the resist pattern 9 as a mask. Gaps 10 are thus formed between the lower wires 7.

Then, as shown in FIG. 17A, the resist pattern 9 is removed.

Then, as shown in FIG. 17B, an interlayer insulating film 11 is deposited on the surfaces of the inter-wire insulating film 3 and the cap film 8 under a low step coverage condition. Thus, the top of the gaps 10 is closed by the interlayer insulating film 11 to form air gaps 12 between the lower wires 7.

Then, as shown in FIG. 17C, an inter-wire insulating film 13 is deposited on a surface of the interlayer insulating film 11. Lithography and dry etching are then used to form a via hole 14 inside the interlayer insulating film 11 and inter-wire insulating film 13 and to form a wiring groove 15 in an upper part of the interlayer insulating film 11 and inter-wire insulating film 13.

Finally, as shown in FIG. 17D, a barrier film 16 and a Cu film 17 are deposited on a surface of the inter-wire insulating film 13, inside the via hole 14, and inside the wiring groove 15. Parts of the barrier film 16 and the Cu film 17 which stick out from the wiring groove 15 are removed by CMP to form a via 18 and an upper wire 19.

Now, the purpose of the formation of the resist pattern 9 will be described. There are two reasons why the resist pattern 9 is formed.

The first reason is that "the resist pattern 9 can prevent recesses and protrusions from being created". When the intervals between the lower wires 7 are small, the interlayer insulating film 11 completely blocks the top of the gaps 10 to form the well-defined air gaps 12. However, if the intervals between the lower wires 7 are large, the top of the gaps 10 is prevented from being closed even with the deposition of the interlayer insulating film 11. This results in the creation of large recesses and protrusions. When such recesses and protrusions are formed in a semiconductor device, the dimensional controllability of photolithography may be degraded. For example, the width of the wires may be larger or smaller than a designed value. This phenomenon may reduce the yield and reliability of the semiconductor device. Thus, if the intervals between the lower wires 7 are large, the resist pattern 9 needs to be formed in the appropriate areas to prevent the formation of the gaps 10.

The second reason is that "the resist pattern 9 can prevent the via and the air gap from contacting each other". Without the resist pattern 9, the air gaps 12 are also formed around the periphery of the via 18. In this situation, when the lower wire 7 and the via 18 are misaligned, the via 18 may contact the air gap 12. In this case, in the steps shown in FIGS. 17C and 17D, various substances may flow into the air gap 12, reducing the yield and reliability of the semiconductor device.

To prevent this phenomenon, the resist pattern 9 needs to be formed in the area where the via 18 is formed, to adjust the positions where the gaps 10 are formed (see, for example, Patent Document 1).

DISCLOSURE OF THE INVENTION

However, the inventors have found that the conventional technique poses the following problems.

To form the gaps 10, the conventional technique partly etches the interlayer insulating film 2 and the inter-wire insulating film 3 through the cap film 8 and the resist pattern 9 as a mask. However, since the selection ratio of the cap film 8 to the interlayer insulating film 2 and the inter-wire insulating film 3 is finite, the cap film 8 is unavoidably thinned or lost during the etching.

When the cap film 8 is thinned or lost, the following characteristics required for the cap film 8 are degraded.

(1) The adhesion to the Cu film 6,
(2) The barrier properties against Cu atoms in the Cu film 6, and
(3) The barrier properties against Si or O atoms in the interlayer insulating film 11.

This disadvantageously reduces the yield and reliability of the semiconductor device.

The present invention is devised in view of these problems. An object of the present invention is to provide a method of manufacturing a semiconductor device which enables a sufficient reduction in the capacity between wires and which offers a high yield and increased reliability.

To accomplish this object, a method of manufacturing a semiconductor device according to the present invention, the semiconductor device having at least one wiring layer formed therein and an air gap formed in any wiring layer area to reduce inter-wire capacity, includes the steps of, when forming the wiring layer in which the air gap is formed, forming a first insulating film on a semiconductor substrate or a lower wiring layer, forming a plurality of wires in an upper part of the first insulating film, forming a first cap film on the wires, forming a mask pattern on an air gap non-forming area of the first insulating film and the first cap film, at least partly etching the first cap film and the first insulating film in an air gap forming area through the mask pattern as a mask to form a gap, removing the mask pattern, forming a second cap film on the first cap film in the air gap forming area, and depositing a second insulating film on the gap, the first cap film, and the second cap film to form the air gap from the gap in the air gap forming area.

Furthermore, in the step of forming the gap, all of the first cap film is etched.

Furthermore, a method of manufacturing a semiconductor device according to the present invention, the semiconductor device having at least one wiring layer formed therein and an air gap formed in any wiring layer area to reduce inter-wire capacity, includes the steps of, when forming the wiring layer in which the air gap is formed, forming a first insulating film on a semiconductor substrate or a lower wiring layer, forming a plurality of wires in an upper part of the first insulating film, forming a liner film on the first insulating film and the wires, forming a mask pattern on an air gap non-forming area of the liner film, etching away the liner film on an air gap forming area through the mask pattern as a mask, at least partly etching the first insulating film in the air gap forming area through the mask pattern as a mask to form a gap, removing the mask pattern, forming a second cap film on the wires in the air gap forming area, and depositing a second insulating film on the gap, the liner film, and the second cap film to form the air gap from the gap in the air gap forming area.

The method further includes a step of forming a first cap film on the wires before the step of forming the liner film, and in the step of forming the gap, the first cap film is also etched.

Furthermore, the first cap film and the second cap film are formed of the same material.

Furthermore, the first cap film and the second cap film are formed of different materials.

The method further includes a step of depositing, on the liner film, a wetting film having higher hydrophilicity than the liner film before the step of forming the mask pattern, and in the step of etching away the liner film, the wetting film is also removed through the mask pattern as a mask, and in the step of forming the air gap, the second insulating film is deposited on the cap, the wetting film, and the second cap film.

The method further includes a step of forming a first cap film on the wires between the step of forming the wires and the step of forming the liner film, and in the step of etching away the liner film, the first cap film is removed through the mask pattern as a mask.

Furthermore, the wetting film includes $SiO_2$ as a main component.

Furthermore, the liner film is any of an SiC film, an SiCO film, an SiCN film, an SiC film, an SiN film, and an SiON film or a film stack of any of the films.

Furthermore, a method of manufacturing a semiconductor device according to the present invention, the semiconductor device having at least one wiring layers formed therein and an air gap formed in any wiring layer area to reduce inter-wire capacity, includes the steps of, when forming the wiring layer in which the air gap is formed, forming a first insulating film on a semiconductor substrate or a lower wiring layer, forming a plurality of wires each including a metal film and a barrier metal film, on the first insulating film, forming a mask pattern on an air gap non-forming area of the first insulating film, at least partly etching the barrier metal film and the first insulating film in an air gap forming area through the mask pattern as a mask to form a gap, removing the mask pattern, forming a second cap film in an upper part of and on a side wall portion of the metal film in the air gap forming area, and depositing a second insulating film on the gap and the second cap film to form the air gap from the gap in the air gap forming area.

The method also includes a step of forming a first cap film on the wires between the step of forming the wires and the step of forming the mask pattern, and in the step of forming the gap, the first cap film is etched through the mask pattern as a mask.

Furthermore, the metal film contains a copper film or a copper alloy film.

Furthermore, the wires contain a copper film or a copper alloy film.

Furthermore, the wires contain a copper film or a copper alloy film.

Furthermore, each of the first cap film and the second cap film is any of a Co film, a Co alloy film, an Ni film, an Ni alloy film, a W film, a W alloy film, and a Cu alloy film.

Furthermore, each of the first cap film and the second cap film is any of a Co film, a Co alloy film, an Ni film, an Ni alloy film, a W film, a W alloy film, and a Cu alloy film.

Furthermore, the first insulating film is any of an $SiO_2$ film, an SiOC film, an SiOF film, a BCB film, and an SiLK film.

Furthermore, the first insulating film is any of an $SiO_2$ film, an SiOC film, an SiOF film, a BCB film, and an SiLK film.

DESCRIPTION OF THE EMBODIMENTS

First Embodiment

A first embodiment of the present invention will be described below with reference to FIGS. 1A, 1B, 1C, 1D, 1E, 2A, 2B, 2C, 2D, 3A, 3B, and 3C. FIGS. 1A, 1B, 1C, 1D, 1E, 2A, 2B, 2C, and 2D are sectional views illustrating steps of a method of manufacturing a semiconductor device according to the first embodiment. FIGS. 3A, 3B, and 3C are sectional views illustrating steps of the method of manufacturing the semiconductor device in which a second cap film is formed before a resist pattern is removed according to the first embodiment.

Figure 1A:
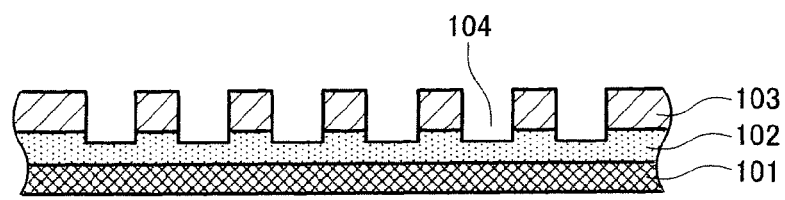
FIG. 1A is a sectional view illustrating a step of a method of manufacturing a semiconductor device according to a first embodiment.

First, as shown in FIG. 1A, an interlayer insulating film 102 and an inter-wire insulating film 103 are deposited on a surface of a semiconductor substrate 101. Wiring grooves 104 are then formed in an upper part of a film stack of the interlayer insulating film 102 and the inter-wire insulating film 103 by photolithography and dry etching. In the present embodiment, an SiOC film is used as the interlayer insulating film 102, and an $SiO_2$ film is used as the inter-wire insulating film 103. The wiring grooves 104 are designed to be spaced at intervals of, for example, at least 70 nm. Here, the upper limit of a wiring interval, which may depend on a method of depositing an interlayer insulating film 112, is about double the minimum wiring interval.

Figure 1B:
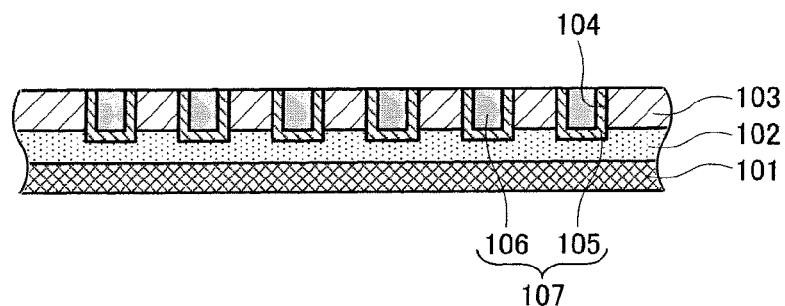
FIG. 1B is a sectional view illustrating a step of the method of manufacturing the semiconductor device according to the first embodiment.

Then, as shown in FIG. 1B, a barrier film 105 and a Cu film 106 are sequentially formed on a top surface of the inter-wire insulating film 103 and inside the wiring grooves 104. Parts of the barrier film 105 and Cu film 106 which stick out from the wiring grooves 104 are then removed by CMP to form lower wires 107. In the present embodiment, a film obtained by stacking a Ta film and a TaN film in this order from the bottom is used as the barrier film 105.

Figure 1C:
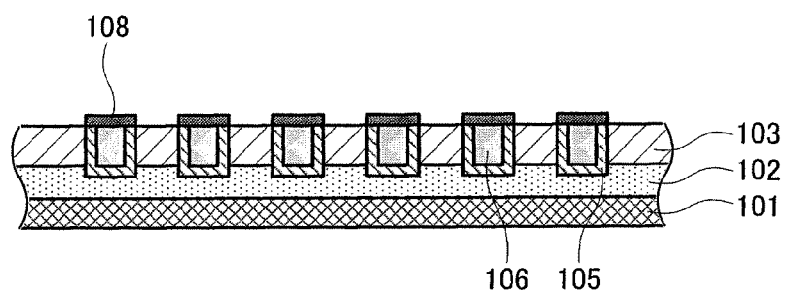
FIG. 1C is a sectional view illustrating a step of the method of manufacturing the semiconductor device according to the first embodiment.

Then, as shown in FIG. 1C, a first cap film 108 is selectively grown on a surface of the Cu film 106. In the present embodiment, a CoWP film of about 15 nm in thickness is used as the first cap film 108.

Figure 1D:
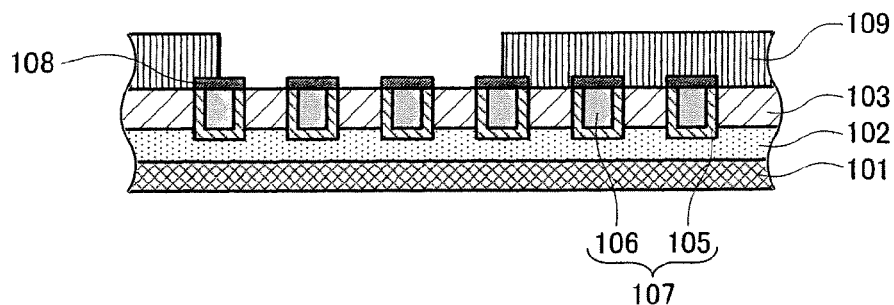
FIG. 1D is a sectional view illustrating a step of the method of manufacturing the semiconductor device according to the first embodiment.

Then, as shown in FIG. 1D, a resist pattern 109 is formed by lithography at an air gap non-forming area on surfaces of the inter-wire insulating film 103 and the first cap film 108; the air gap non-forming area is a position where no air gap is formed.

Figure 1E:
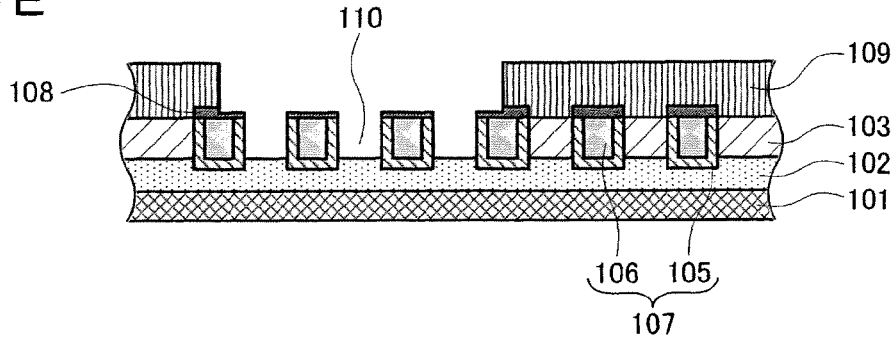
FIG. 1E is a sectional view illustrating a step of the method of manufacturing the semiconductor device according to the first embodiment.

Then, as shown in FIG. 1E, the interlayer insulating film 102 and the inter-wire insulating film 103 are partly etched through the resist pattern 109 as a mask. Gaps 110 are thus formed between the lower wires 107 in an air gap forming area where the interval between the lower wires 107 is equal to or smaller than a given value and where no via is formed. In this case, the first cap film 108 is thinned in an area not covered with the resist pattern 109. In the present embodiment, the first cap film 108 in the area not covered with the resist pattern 109 has a thickness of about 5 nm.

Figure 2A:
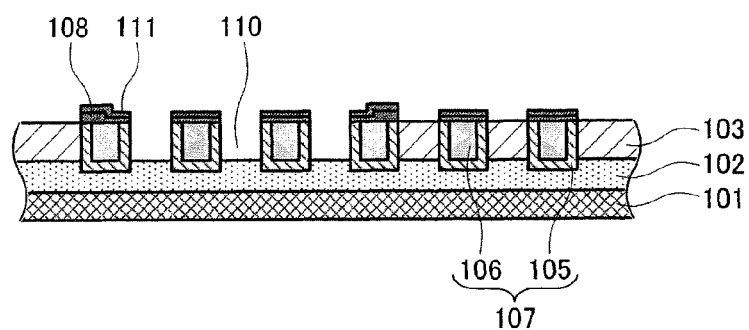
FIG. 2A is a sectional view illustrating a step of the method of manufacturing the semiconductor device according to the first embodiment.
Figure 3A:
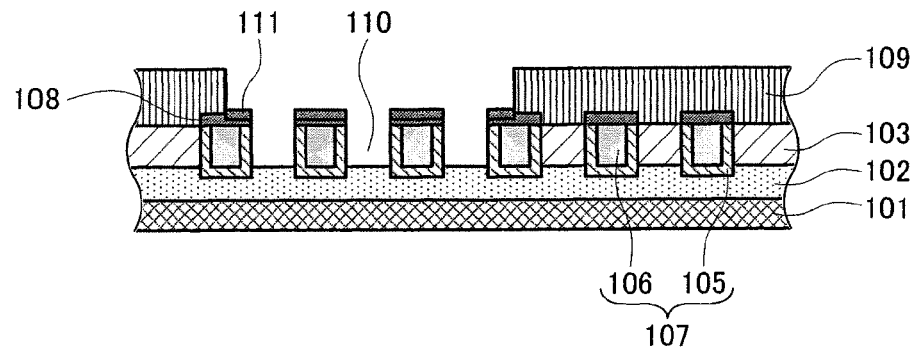
FIG. 3A is a sectional view illustrating a step of the method of manufacturing the semiconductor device in which a second cap film is formed before a resist pattern is removed according to the first embodiment.
Figure 3B:
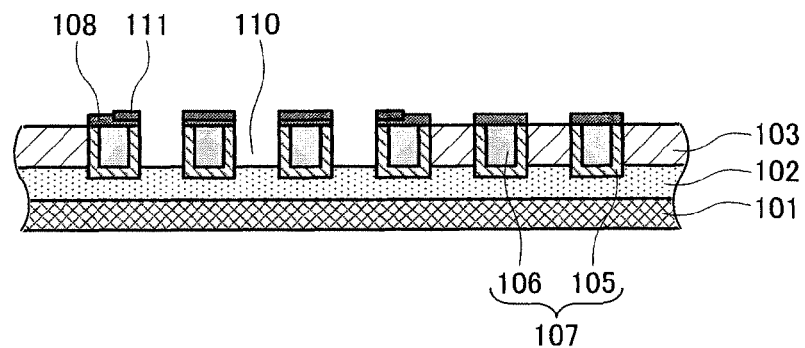
FIG. 3B is a sectional view illustrating a step of the method of manufacturing the semiconductor device in which the second cap film is formed before the resist pattern is removed according to the first embodiment.
Figure 3C:
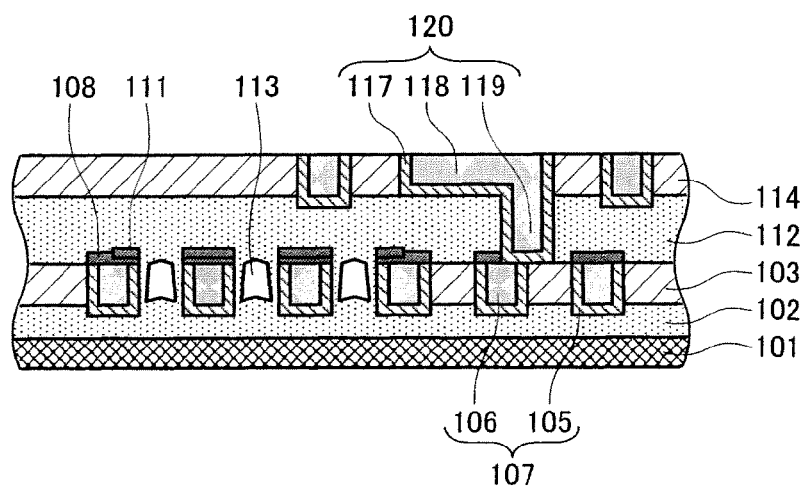
FIG. 3C is a sectional view illustrating a step of the method of manufacturing the semiconductor device in which the second cap film is formed before the resist pattern is removed according to the first embodiment.
Figure 4A:
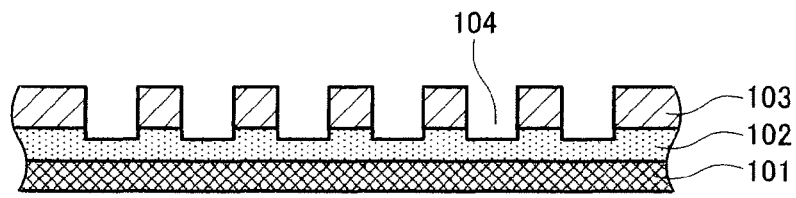
FIG. 4A is a sectional view illustrating a step of a method of manufacturing a semiconductor device according to a second embodiment.
Figure 4B:
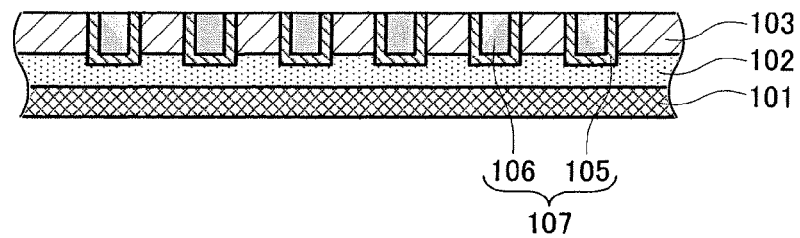
FIG. 4B is a sectional view illustrating a step of the method of manufacturing the semiconductor device according to the second embodiment.
Figure 4C:
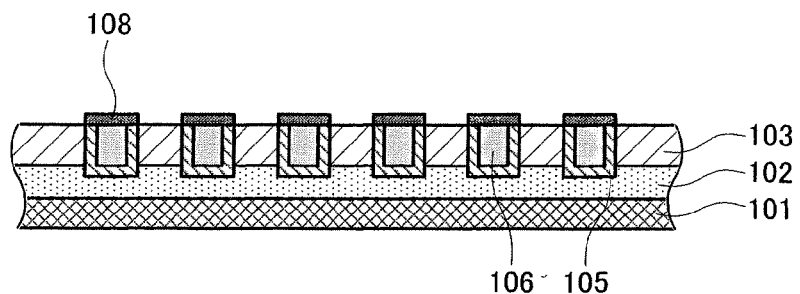
FIG. 4C is a sectional view illustrating a step of the method of manufacturing the semiconductor device according to the second embodiment.
Figure 4D:
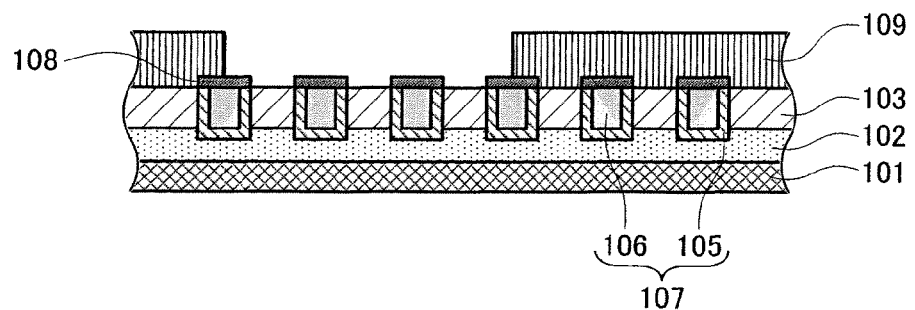
FIG. 4D is a sectional view illustrating a step of the method of manufacturing the semiconductor device according to the second embodiment.
Figure 4E:
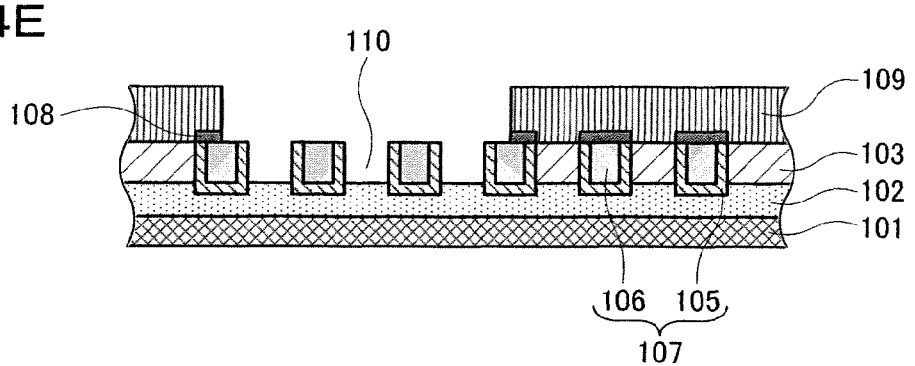
FIG. 4E is a sectional view illustrating a step of the method of manufacturing the semiconductor device according to the second embodiment.

Then, as shown in FIG. 2A, the resist pattern 109 is removed. A second cap film 111 is then selectively grown on a surface of the first cap film 108. This is the most important feature of the present embodiment.

A material for second cap film 111 may be different from that for the first cap film 108. However, if the material for the second cap film 111 used is the same as that for the first cap film 108, the first cap film 108 and the second cap film 111 can be contacted with each other more closely.

In the present embodiment, the thickness of the second cap film 111 is set to about 15 nm. Thus, the cap film in the area not covered with the resist pattern 109 has a thickness of about 20 nm, corresponding to the sum of the thickness of the first cap film 108, about 5 nm, and the thickness of the second cap film 111, about 15 nm. Consequently, a sufficiently close contact and a sufficient barrier property can be achieved in the area not covered with the resist pattern 109. This makes it possible to manufacture a semiconductor device with a high yield and increased reliability.

Figure 2B:
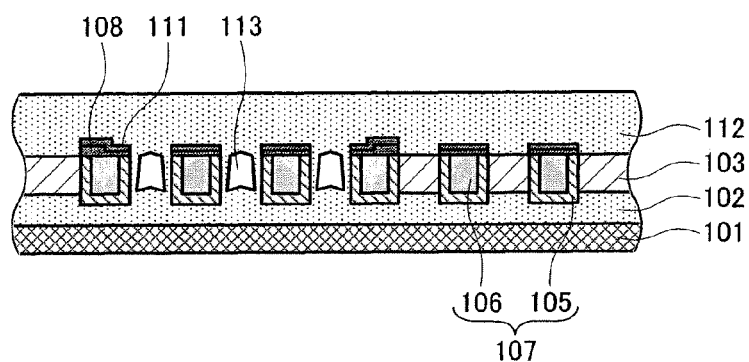
FIG. 2B is a sectional view illustrating a step of the method of manufacturing the semiconductor device according to the first embodiment.

Then, as shown in FIG. 2B, an interlayer insulating film 112 is deposited on surfaces of the inter-wire insulating film 103, the first cap film 108, and the second cap film 111 by CVD with a lower step coverage. Thus, the top of the gaps 110 is closed by the interlayer insulating film 112 to form air gaps 113 between the lower wires 107. In the present embodiment, an SiOC film is used as the interlayer insulating film 112. This enables a reduction in the capacity of the interlayer insulating film.

Figure 2C:
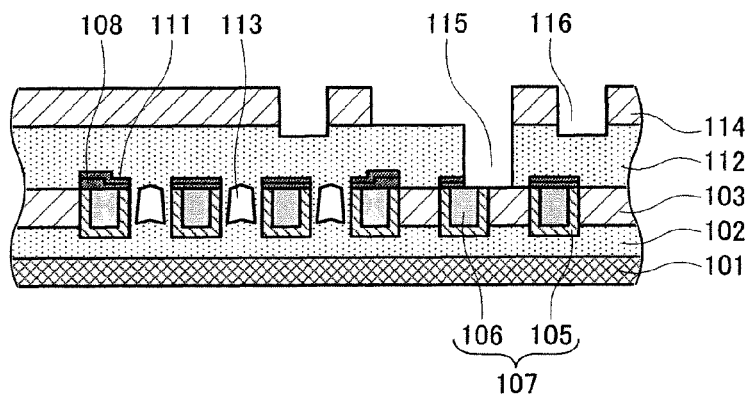
FIG. 2C is a sectional view illustrating a step of the method of manufacturing the semiconductor device according to the first embodiment.

Then, as shown in FIG. 2C, an inter-wire insulating film 114 is deposited on a surface of the interlayer insulating film 112. Lithography and dry etching are then used to form a via hole 115 and a wiring groove 116 inside a film stack of the interlayer insulating film 112 and the inter-wire insulating film 114.

In the present embodiment, an $SiO_2$ film is used as the inter-wire insulating film 114.

Figure 2D:
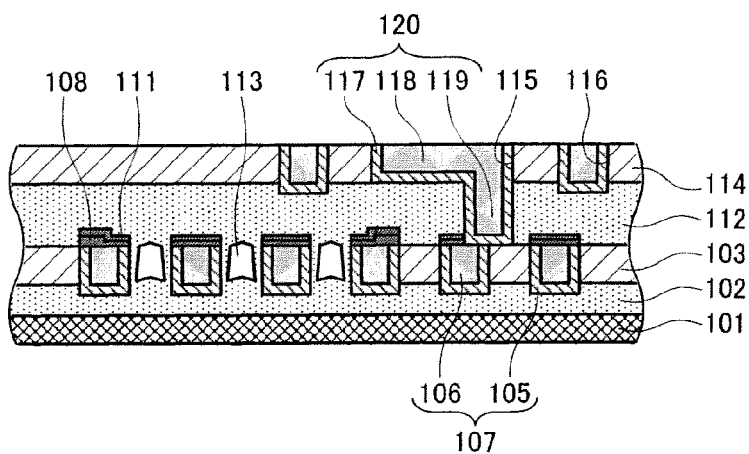
FIG. 2D is a sectional view illustrating a step of the method of manufacturing the semiconductor device according to the first embodiment.

Finally, as shown in FIG. 2D, a barrier film 117 and a Cu film 118 are deposited on a surface of the inter-wire insulating film 114, inside the via hole 115, and inside the wiring groove 116. Parts of the barrier film 117 and the Cu film 118 which stick out from the wiring groove 116 are then removed by CMP to form a via 119 and an upper wire 120.

The completed semiconductor device is characterized in that:

(1) the air gap is formed in a part of the area between the wires, and (2) the cap film is selectively deposited on the surfaces of the wires.

The second cap film is thus deposited on the wires after the formation of the gaps, so that even if the first cap film is thinned in the wires, located adjacent to the air gaps, the second cap film enables the appropriate setting of the thickness of a cap layer composed of the first cap film and the second cap film. This makes it possible to sufficiently reduce the capacity between the wires and to increase the yield and reliability.

Now, description will be given of a preferred method of setting the thickness of the first cap film 108. The thickness of the first cap film 108 is preferably set to 30% or less of the interval between the lower wires 107. This is because setting the thickness of the first cap film 108 to be too large may cause the first cap film 108 to grow granularly using metal contamination on the surface of the inter-wire insulating film 103 as a nucleus. This phenomenon may short-circuit the lower wires 107 to reduce the yield and reliability of the semiconductor device.

Now, description will be given of a method of setting the thickness of the second cap film 111. The thickness of the second cap film 111 is preferably set equal to or larger than that of the first cap film 108 that has been thinned by etching. This sufficiently increases the sum of the thicknesses of the first cap film 108 and the second cap film 111 to make it possible to ensure the following characteristics required for the cap film:

(1) The adhesion to the Cu film 106, (2) The barrier properties against Cu atoms in the Cu film 106, and (3) The barrier properties against Si or O atoms in the interlayer insulating film 112.

This enables the manufacture of a semiconductor device with a high yield and increased reliability.

Here, the inter-wire insulating film 103 is removed from an area where no via is formed and the interval between the lower wires 107 is small. This prevents the first cap film 108 from growing in this area using the metal contamination on the surface of the inter-wire insulating film 103 as a nucleus. On the other hand, in the area where no via is formed and the interval between the lower wires 107 is small, unintended electric conduction is prevented from occurring between the lower wires 107. Thus, the second cap film 111 can be deposited thicker than the first cap film 108, thus improving the yield and reliability.

A CoWP film is used as the first cap film 108 and the second cap film 111. However, instead of the CoWP film, any other film can be used which can grow selectively on the surfaces of the lower wires 107. Examples of such a film include a Co film, a Co alloy film, an Ni film, an Ni alloy film, a W film, a W alloy film, and a Cu alloy film.

Furthermore, as described above, the material for the second cap film 111 used may be different from that for the first cap film 108. The material for the second cap film 111 may be an amorphous compound of Co, W, Si, and N which can be grown by exposing the first cap film 108 to a silicon compound such as silane and then to a plasma of a nitrogen compound such as ammonia. The amorphous compound can be grown, for example, during a pretreatment carried out before the deposition of the interlayer insulating film 112. Thus, the effects of the first and second cap films as a cap can be enhanced by the combination of the first and second cap films.

When the first cap film 108 and the second cap film 111 are formed of different materials, it is possible to use a CoWP film as the first cap film 108 and a CuSiN film as the second cap film 121. Alternatively, it is possible to use the CuSiN film as the first cap film 108 and the CoWP film as the second cap film 121. Furthermore, instead of the CoWP film and the CuSiN film, any other films can be used which can be selectively grown on the surfaces of the lower wires 107. Examples of such a film include a Co film, a Co alloy film, an Ni film, an Ni alloy film, a W film, a W alloy film, and a Cu alloy film.

In the above description, after the resist pattern 109 is removed, the second cap film 111 is selectively grown on the surface of the first cap film 108. However, as shown in FIG. 3A, the second cap film 111 may be selectively grown on the surface of the first cap film 108 before the resist pattern 109 is removed. Subsequently, as shown in FIG. 3B, the resist pattern 109 is removed, and such steps as shown in FIGS. 2B, 2C, and 2D are carried out to complete such a semiconductor device as shown in FIG. 3C.

Here, the thicknesses of the first cap film 108 and the second cap film 111 are similar to those described above. Thus, the cap film in the air gap forming area not covered with the resist pattern 109 has a thickness of about 20 nm, corresponding to the sum of the thickness of the first cap film 108, about 5 nm, and the thickness of the second cap film 111, about 15 nm. The cap film in the air gap non-forming area covered with the resist pattern 109 has a thickness of about 15 nm, corresponding to the thickness of only the first cap film 108. The film thickness of the entire cap film is larger in the area not covered with the resist pattern 109 than in the area covered with the resist pattern 109.

The completed semiconductor device is structurally characterized in that:

(1) the air gaps are each formed in a part of the area between the wires, (2) the cap film is selectively deposited on the surfaces of the wires.

Further, in the present embodiment, (3) a part of the cap film in the air gap non-forming area which is located adjacent to the air gap may be thicker than a part of the cap film in the air gap non-forming area which is not located adjacent to the air gap. This makes it possible to inhibit the reliability from being degraded.

The second cap film is thus deposited on the wires after the formation of the gaps, so that even if the first cap film is thinned in the wires, located adjacent to the air gaps, the second cap film enables the appropriate setting of the thickness of the cap layer composed of the first cap film and the second cap film. This makes it possible to sufficiently reduce the capacity between the wires and to increase the yield and reliability.

Also in this case, the first cap film 108 and the second cap film 111 may be formed of different materials.

Second Embodiment

A second embodiment of the present invention will be described below with reference to FIGS. 4A, 4B, 4C, 4D, 4E, 5A, 5B, 5C, 5D, 6A, 6B, and 6C. Only the differences of the present embodiment from the first embodiment will be described. The description of parts similar to those in the first embodiment is omitted.

FIGS. 4A, 4B, 4C, 4D, 4E, 5A, 5B, 5C, and 5D are sectional views illustrating steps of a method of manufacturing a semiconductor device according to the second embodiment. FIGS. 6A, 6B, and 6C are sectional views illustrating steps of the method of manufacturing the semiconductor device in which a second cap film is formed before a resist pattern is removed according to the second embodiment.

Figure 5A:
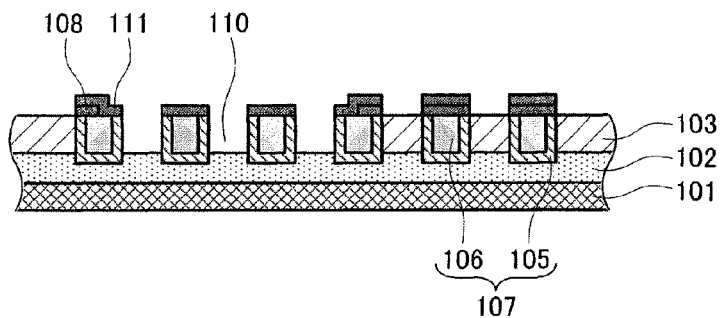
FIG. 5A is a sectional view illustrating a step of the method of manufacturing the semiconductor device according to the second embodiment.
Figure 6A:
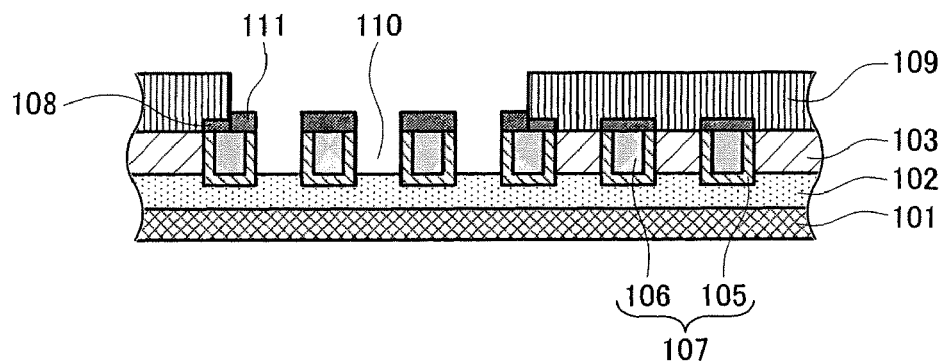
FIG. 6A is a sectional view illustrating a step of the method of manufacturing the semiconductor device in which a second cap film is formed before a resist pattern is removed according to the second embodiment.
Figure 6B:
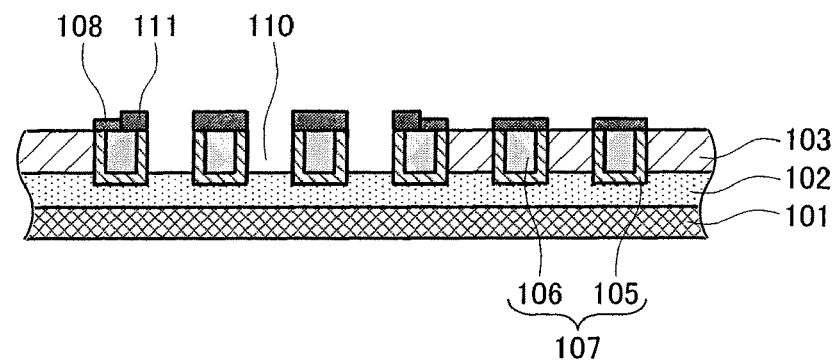
FIG. 6B is a sectional view illustrating a step of the method of manufacturing the semiconductor device in which the second cap film is formed before the resist pattern is removed according to the second embodiment.
Figure 6C:
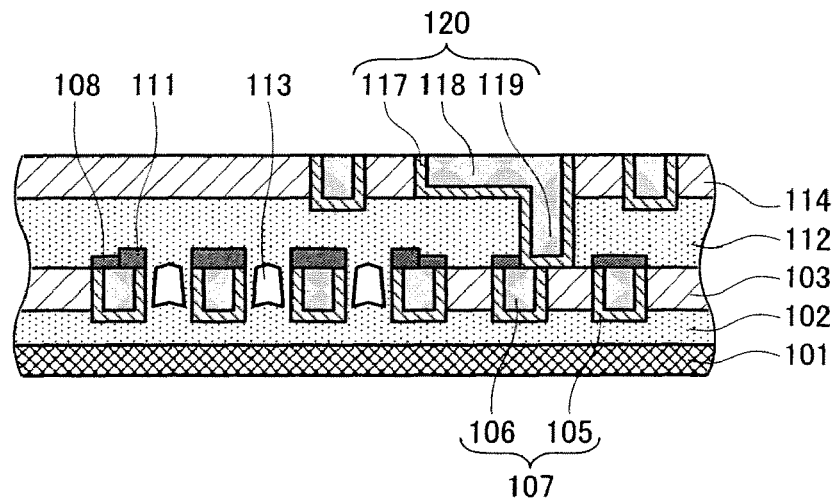
FIG. 6C is a sectional view illustrating a step of the method of manufacturing the semiconductor device in which the second cap film is formed before the resist pattern is removed according to the second embodiment.

The present embodiment is different from the first embodiment in that a first cap film 108 has a fixed thickness of 10 nm in FIG. 5A. Thus, in FIG. 4E, when gaps 110 are each formed between lower wires 107, the first cap film 108 in an air gap forming area, which is not covered with a resist pattern 109, is eliminated. Then, as shown in FIG. 5A, the resist pattern 109 is removed, and the second cap film 111 is selectively grown on an exposed surface of a Cu film 106 and an exposed surface of the first cap film 108. This is the most important feature of the present embodiment.

Thus, the first cap film on each of the wires located adjacent to the corresponding air gap is removed, and the second cap film is then formed on the unremoved first cap film and on the Cu film in the exposed wire. This makes it possible to appropriately set the thickness of a cap layer, made up of the second cap film and provided in the wire located adjacent to the air gap. Consequently, the capacity between the wires can be sufficiently reduced to improve the yield and reliability.

The material for the second cap film 111 may be different from that for the first cap film 108. However, when the material for the second cap film 111 is the same as that for the first cap film 108, the first cap film 108 and the second cap film 111 can be contacted with each other more closely.

In the present embodiment, the thickness of the second cap film 111 is set to about 15 nm. Thus, the cap film in the area not covered with the resist pattern 109 has a thickness of about 15 nm, corresponding to the thickness of only the second cap film 111. The cap film in an area covered with the resist pattern 109 has a thickness of about 25 nm, corresponding to the sum of the thickness of the first cap film 108 and the thickness of the second cap film 111. The film thickness of the entire cap film is larger in the area covered with the resist pattern 109 than in the area not covered with the resist pattern 109.

The completed semiconductor device is structurally characterized in that:

(1) the air gaps are each formed in a part of the area between the wires, and (2) the cap film is selectively deposited on the surfaces of the wires. Thus, in the wire located adjacent to the air gap, even when the first cap film is removed during the formation of the gap, the second cap film can be formed on the exposed copper film to set the thickness of the cap film to an appropriate value. This makes it possible to sufficiently reduce the capacity between the wires and to improve the yield and reliability.

In the description of the present embodiment, a CoWP film is used as the first cap film 108 and the second cap film 111. However, instead of the CoWP film, any other film can be used which can grow selectively on surfaces of the lower wires 107. Examples of such a film include a Co film, a Co alloy film, an Ni film, an Ni alloy film, a W film, a W alloy film, and a Cu alloy film.

Furthermore, as described above, the material for the second cap film 111 used may be different from that for the first cap film 108. The material for the second cap film 111 may be an amorphous compound of Co, W, Si, and N which can be grown by exposing the first cap film 108 to a silicon compound such as silane and then to a plasma of a nitrogen compound such as ammonia. The amorphous compound can be grown, for example, during a pretreatment carried out before the deposition of an interlayer insulating film 112. Thus, the effects of the first and second cap films as a cap can be enhanced by the combination of the first and second cap films.

When the first cap film 108 and the second cap film 111 are formed of different materials, it is possible to use a CoWP film as the first cap film 108 and a CuSiN film as the second cap film 121. Alternatively, it is possible to use the CuSiN film as the first cap film 108 and the CoWP film as the second cap film 121. Furthermore, instead of the CoWP film and the CuSiN film, any other films can be used which can be selectively grown on the surfaces of the lower wires 107. Examples of such a film include a Co film, a Co alloy film, an Ni film, an Ni alloy film, a W film, a W alloy film, and a Cu alloy film.

Figure 5B:
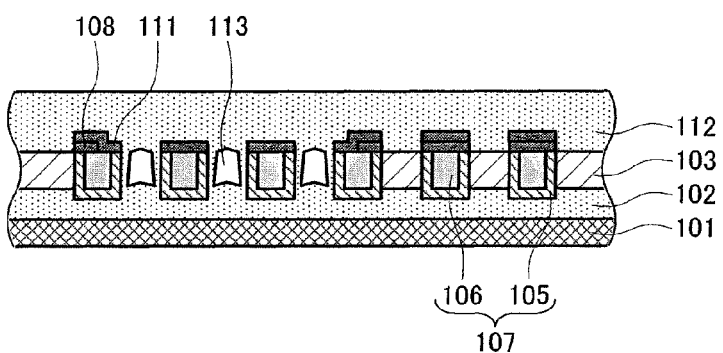
FIG. 5B is a sectional view illustrating a step of the method of manufacturing the semiconductor device according to the second embodiment.
Figure 5C:
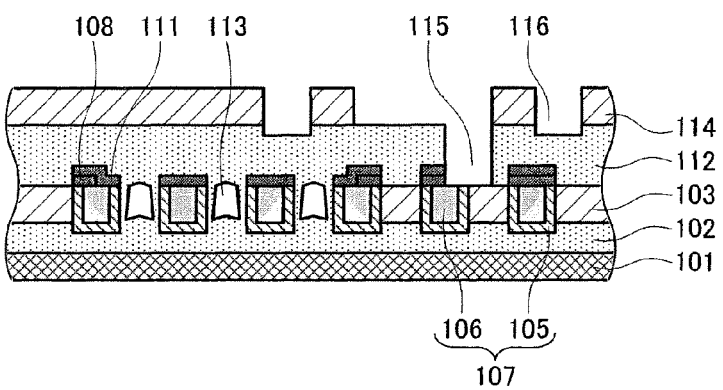
FIG. 5C is a sectional view illustrating a step of the method of manufacturing the semiconductor device according to the second embodiment.
Figure 5D:
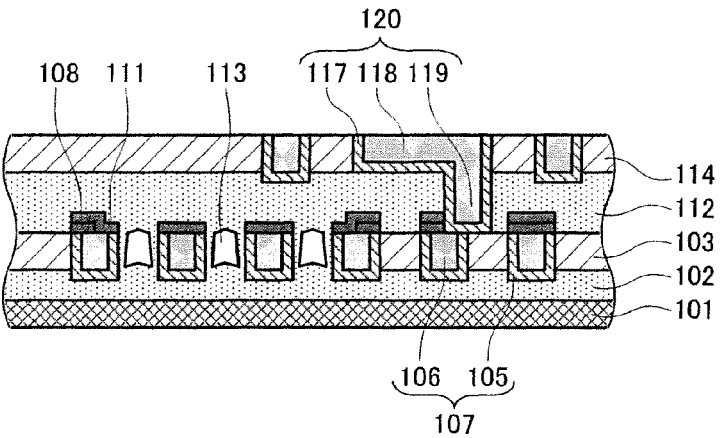
FIG. 5D is a sectional view illustrating a step of the method of manufacturing the semiconductor device according to the second embodiment.

In the above description, after the resist pattern 109 is removed, the second cap film 111 is selectively grown on the surface of the first cap film 108. However, as shown in FIG. 6A, the second cap film 111 may be selectively grown on the surface of the first cap film 108 before the resist pattern 109 is removed. Subsequently, as shown in FIG. 6B, the resist pattern 109 is removed, and such steps as shown in FIGS. 5B, 5C, and 5D are carried out to complete such a semiconductor device as shown in FIG. 6C.

Here, the thicknesses of the first cap film 108 and the second cap film 111 are similar to those described above. Thus, the cap film in the area not covered with the resist pattern 109 has a thickness of about 15 nm, corresponding to the thickness of only the second cap film 111. The cap film in the air gap non-forming area covered with the resist pattern 109 has a thickness of about 10 nm, corresponding to the thickness of only the first cap film 108. The film thickness of the entire cap film is larger in the area not covered with the resist pattern 109 than in the area covered with the resist pattern 109.

The completed semiconductor device is structurally characterized in that:

(1) the air gaps are each formed in a part of the area between the wires, (2) the cap film is selectively deposited on the surfaces of the wires, and (3) the cap film is a single layer film.

Moreover, the present embodiment may have the following configuration.

(4) A part of the cap film in the air gap non-forming area which is located adjacent to the air gaps is thicker than a part of the cap film in the air gap non-forming area which is not located adjacent to the air gaps.

As described above, in the wire located adjacent to the air gap, even when the first cap film is removed during the formation of the gap, the second cap film can be formed on the exposed copper film to set the thickness of the cap film to an appropriate value. This makes it possible to sufficiently reduce the capacity between the wires and to improve the yield and reliability.

Also in the present embodiment, the first cap film 108 and the second cap film 111 may be formed of different materials.

Third Embodiment

A third embodiment of the present invention will be described below with reference to FIGS. 7A, 7B, 7C, 7D, 7E, 8A, 8B, 8C, 8D, 9A, 9B, and 9C. Only the differences of the present embodiment from the first embodiment will be described. The description of parts similar to those in the first embodiment is omitted.

FIGS. 7A, 7B, 7C, 7D, 7E, 8A, 8B, 8C, 8D, 9A, 9B, and 9C are sectional views illustrating steps of a method of manufacturing a semiconductor device according to the third embodiment.

Figure 7A:
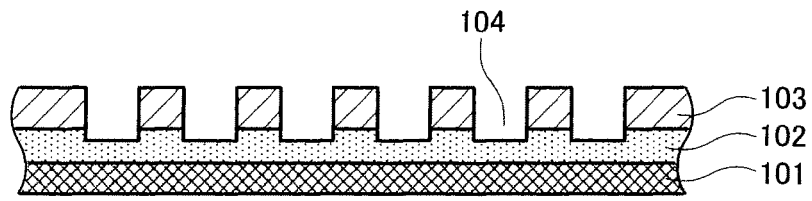
FIG. 7A is a sectional view illustrating a step of a method of manufacturing a semiconductor device according to a third embodiment.
Figure 7B:
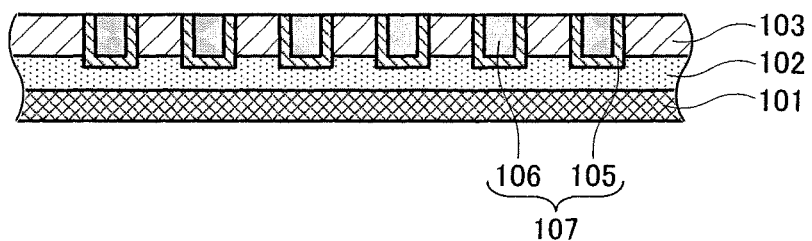
FIG. 7B is a sectional view illustrating a step of the method of manufacturing the semiconductor device according to the third embodiment.
Figure 7C:
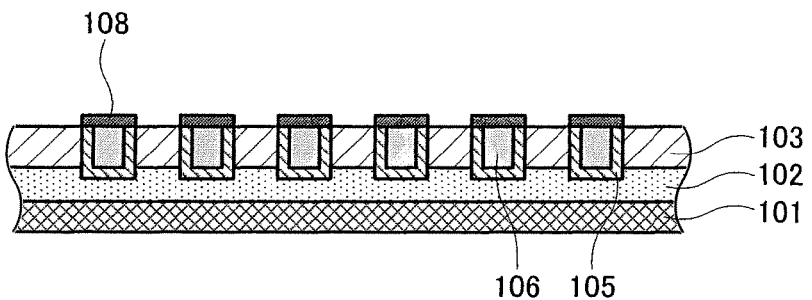
FIG. 7C is a sectional view illustrating a step of the method of manufacturing the semiconductor device according to the third embodiment.
Figure 7D:
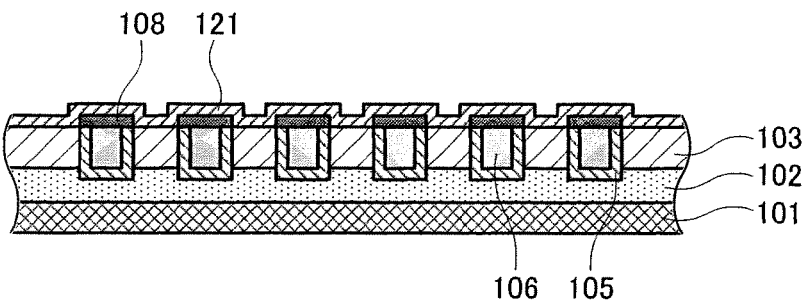
FIG. 7D is a sectional view illustrating a step of the method of manufacturing the semiconductor device according to the third embodiment.

The present embodiment is different from the first embodiment in that a liner film 121 is deposited on surfaces of an inter-wire insulating film 103 and a first cap film 108 as shown in FIG. 7D.

First, as shown in FIG. 7A, an interlayer insulating film 102 and the inter-wire insulating film 103 are deposited on a surface of a semiconductor substrate 101. Wiring grooves 104 are then formed inside the layer stack of the interlayer insulating film 102 and the inter-wire insulating film 103. Then, as shown in FIG. 7B, a barrier film 105 and a Cu film 106 are deposited on the surface of the inter-wire insulating film 103 and inside the wiring grooves 104. Parts of the barrier film 105 and the Cu film 106 which stick out from the wiring grooves 104 are removed by CMP to form lower wires 107. Then, as shown in FIG. 7C, a first cap film 108 is selectively grown on a surface of the Cu film 106. In the present embodiment, a CoWP film of 15 nm in thickness is used as the first cap film 108.

Then, as shown in FIG. 7D, the liner film 121 is deposited about 15 nm in thickness on the surfaces of the inter-wire insulating film 103 and the first cap film 108 by lithography. In the present embodiment, a film formed by depositing SiCN and SiCO in this order is used as the liner film 121.

Figure 7E:
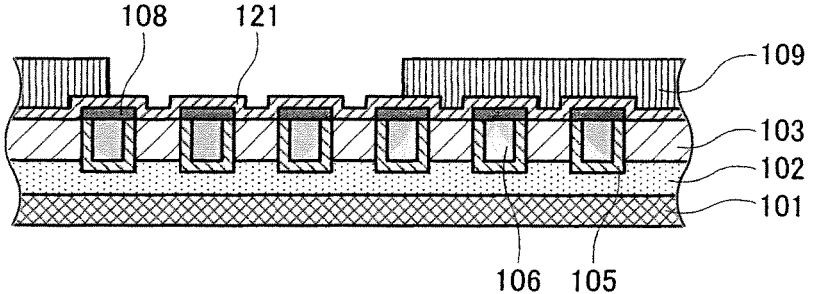
FIG. 7E is a sectional view illustrating a step of the method of manufacturing the semiconductor device according to the third embodiment.
Figure 8A:
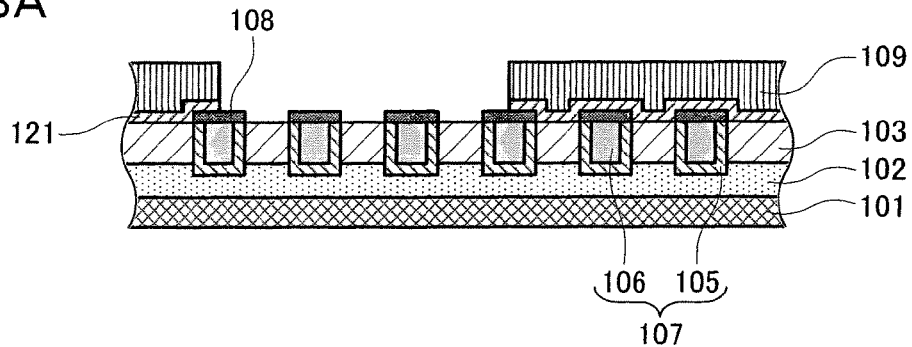
FIG. 8A is a sectional view illustrating a step of the method of manufacturing the semiconductor device according to the third embodiment.
Figure 8B:
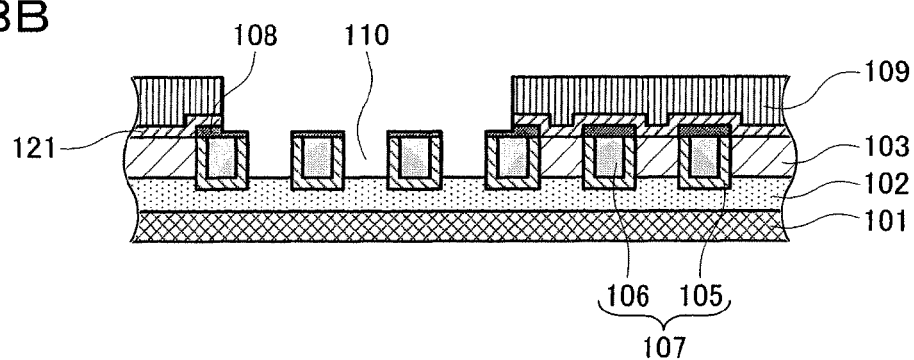
FIG. 8B is a sectional view illustrating a step of the method of manufacturing the semiconductor device according to the third embodiment.

Subsequently, as shown in FIG. 7E, a resist pattern 109 is formed on a surface of the liner film 121. Then, as shown in FIG. 8A, the liner film 121 is etched through the resist pattern 109 as a mask. Then, as shown in FIG. 8B, the interlayer insulating film 102 and the inter-wire insulating film 103 are partly etched through the resist pattern 109 as a mask to form gaps 110 between the lower wires 107. In this case, in an area not covered with the resist pattern 109, the first cap film 108 is thinned. In the present embodiment, the first cap film 108 has a thickness of about 5 nm.

Figure 8C:
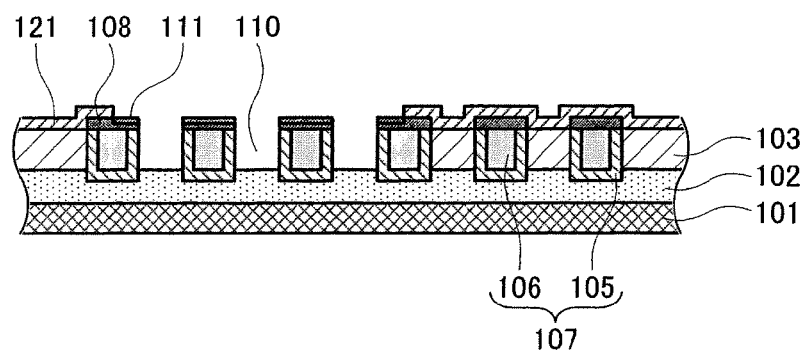
FIG. 8C is a sectional view illustrating a step of the method of manufacturing the semiconductor device according to the third embodiment.

Then, as shown in FIG. 8C, a second cap film 111 is selectively formed on the surface of the first cap film 108 exposed from the liner film 121. In the present embodiment, the thickness of the second cap film 111 is set to about 10 nm. Thus, the cap film in the area not covered with the resist pattern 109 has a thickness of about 15 nm, corresponding to the sum of the thickness of the first cap film 108, about 5 nm, and the thickness of the second cap film 111, about 10 nm. The cap film in an area covered with the resist pattern 109 has a thickness of about 15 nm, corresponding to the thickness of the first cap film 108. The film thickness of the entire cap film in the area covered with the resist pattern 109 is equal to that in the area not covered with the resist pattern 109.

Figure 8D:
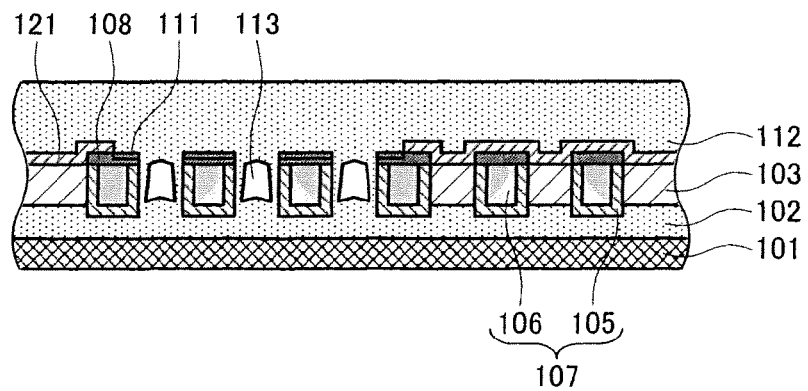
FIG. 8D is a sectional view illustrating a step of the method of manufacturing the semiconductor device according to the third embodiment.

Then, as shown in FIG. 8D, an interlayer insulating film 112 is deposited on the surfaces of the liner film 121 and the second cap film 111. Thus, the top of the gaps 110 is closed by the interlayer insulating film 112 to form air gaps 113 between the lower wires 107.

Figure 9A:
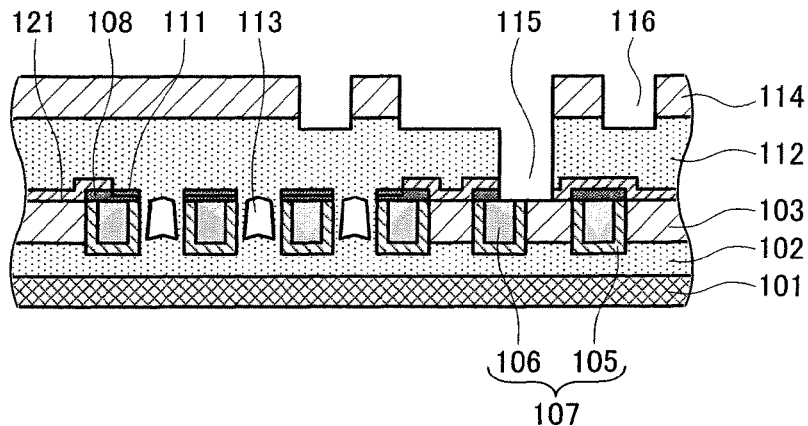
FIG. 9A is a sectional view illustrating a step of the method of manufacturing the semiconductor device according to the third embodiment.
Figure 9B:
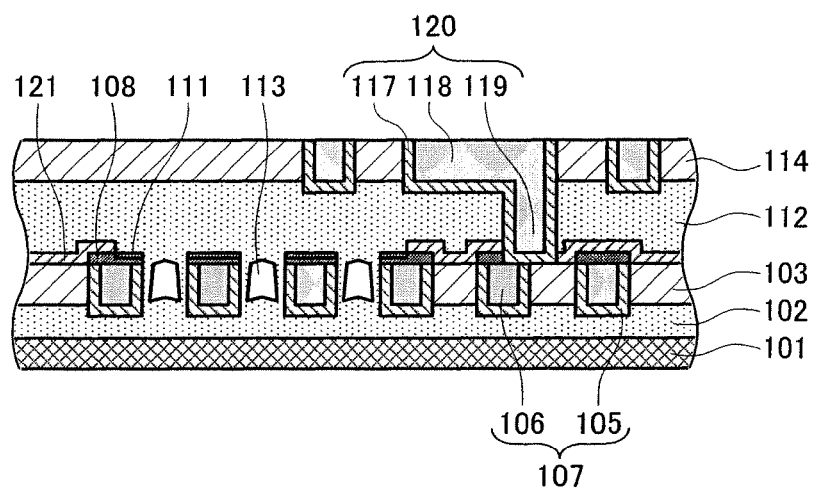
FIG. 9B is a sectional view illustrating a step of the method of manufacturing the semiconductor device according to the third embodiment.

Then, as shown in FIG. 9A, an inter-wire insulating film 114 is deposited on a surface of the interlayer insulating film 112. A via hole 115 and a wiring groove 116 are then formed inside the layer stack of the liner film 121, the interlayer insulating film 112, and the inter-wire insulating film 114 by lithography and dry etching. Finally, as shown in FIG. 9B, a barrier film 117 and a Cu film 118 are deposited on a surface of the inter-wire insulating film 114 and inside the via hole 115 and the wiring groove 116. Parts of the barrier film 117 and the Cu film 118 which stick out from the wiring grooves 116 are then removed by CMP to form a via 119 and an upper wire 120.

The completed semiconductor device is structurally characterized in that:

(1) the air gaps are each formed in a part of the area between the wires, (2) the cap film is selectively deposited on the surfaces of the wires, (3) a part of the cap film in the air gap non-forming area which is located away from the air gaps is a single layer film and is coated with the liner film, and (4) a part of the cap film in the air gap forming area which is located close to the air gaps is a film stack and is not coated with the liner film.

Moreover, the present embodiment may have the following configuration.

(5) A part of the cap film in the air gap non-forming area which is located adjacent to the air gaps is thicker than a part of the cap film in the air gap non-forming area which is not located adjacent to the air gaps.

Thus, even when the first cap film is thinned in the wire located adjacent to the air gap, the second cap film is formed on the thinned first cap film to keep the material and thickness of the cap film in appropriate conditions. This makes it possible to sufficiently reduce the capacity between the wires and to improve the yield and reliability. Moreover, only the air gap non-forming area is covered with the liner film, which can be used as an etching stopper for etching performed to form the via hole. Moreover, the liner film also serves as a barrier to allow the cap film to be thinned. Furthermore, if the liner film is used to thin the cap film, more cap films can be stacked so as to serve as an appropriate barrier.

In the present embodiment, a film obtained by stacking SiCN and SiCO in this order is used as the liner film 121. However, instead of this film, it is possible to use a single layer film or a film stack of an SiC-containing material such as SiC, SiCO, SiCN, or SiC or an SiN-containing material such as SiN or SiON.

In the present embodiment, the liner film 121 is added to the first embodiment, with corresponding changes in the film processed by the resist pattern 109 and the insulating film penetrated by the via hole 115. These changes also apply to the first and second embodiments.

Figure 9C:
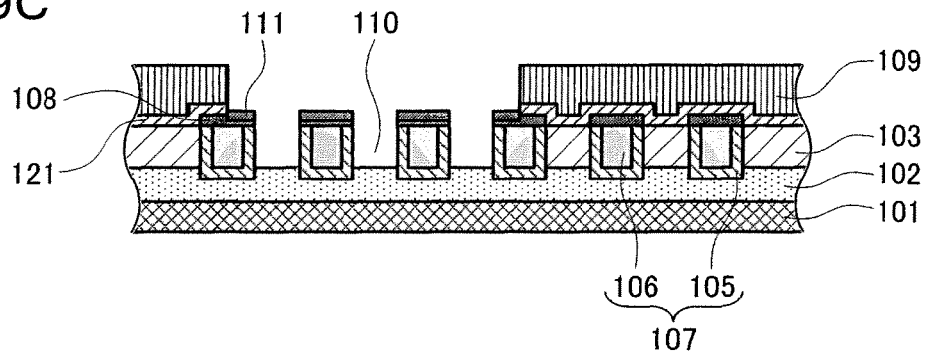
FIG. 9C is a sectional view illustrating a step of the method of manufacturing the semiconductor device according to the third embodiment.

In the above description, after the resist pattern 109 is removed, the second cap film 111 is selectively grown on the surface of the first cap film 108. However, as shown in FIG. 9C, the second cap film 111 may be selectively grown on the surface of the first cap film 108 before the resist pattern 109 is removed. Subsequently, the resist pattern 109 is removed, and the resulting condition is similar to that shown in FIG. 8C. Such steps as shown in FIGS. 8D, 9A, and 9B are then carried out to complete such a semiconductor device as shown in FIG. 9B. In this case, the second cap film is formed to have a thickness of about 15 nm. Then, the cap film in the area not covered with the resist pattern 109 has a thickness of about 20 nm, corresponding to the sum of the thickness of the first cap film 108, about 5 nm, and the thickness of the second cap film 111, about 15 nm. The cap film in the area covered with the resist pattern 109 has a thickness of about 15 nm, corresponding to the thickness of the first cap film 108. The film thickness of the entire cap film is thinner in the area covered with the resist pattern 109 than in the area not covered with the resist pattern 109.

Fourth Embodiment

A fourth embodiment of the present invention will be described below with reference to FIGS. 10A, 10B, 10C, 10D, 10E, 10F, 11A, 11B, 11C, and 11D. Only the differences of the present embodiment from the third embodiment will be described. The description of parts similar to those in the third embodiment is omitted.

FIGS. 10A, 10B, 10C, 10D, 10E, 10F, 11A, 11B, 11C, and 11D are sectional views illustrating steps of a method of manufacturing a semiconductor device according to the fourth embodiment.

Figure 10A:
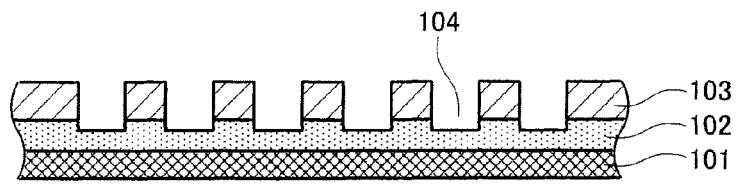
FIG. 10A is a sectional view illustrating a step of a method of manufacturing a semiconductor device according to a fourth embodiment.
Figure 10B:
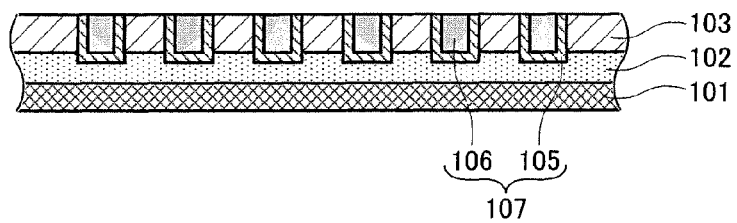
FIG. 10B is a sectional view illustrating a step of the method of manufacturing the semiconductor device according to the fourth embodiment.
Figure 10C:
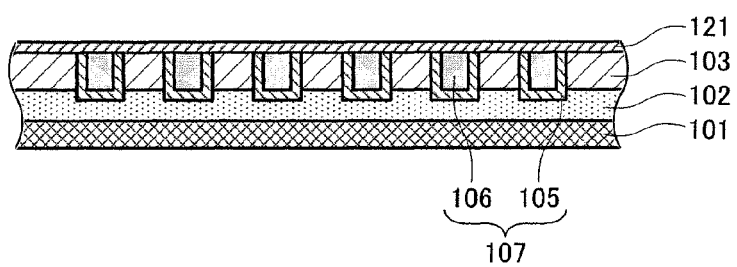
FIG. 10C is a sectional view illustrating a step of the method of manufacturing the semiconductor device according to the fourth embodiment.
Figure 10D:
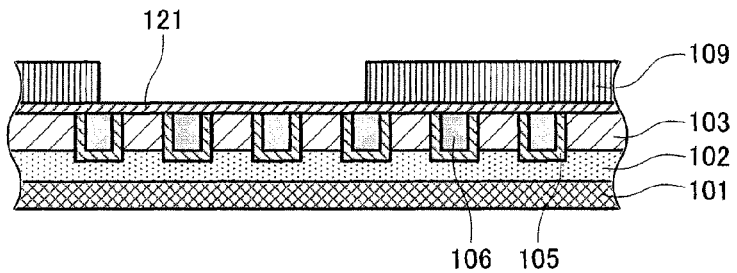
FIG. 10D is a sectional view illustrating a step of the method of manufacturing the semiconductor device according to the fourth embodiment.

The present embodiment is different from the third embodiment in that after the lower wires 107 are formed, the liner film 121 is deposited without growing a cap film, as shown in FIGS. 10C and 10D. Thus, appropriately selecting the type of the liner film may allow the liner film alone to ensure a sufficiently close contact and a barrier property without the need for the stack structure of the cap film and the liner film. An example of such a liner film is a film obtained by stacking SiCN and SiCO in this order. This enables a reduction in costs required to manufacture the semiconductor device.

First, as shown in FIG. 10A, an interlayer insulating film 102 and an inter-wire insulating film 103 are deposited on a surface of a semiconductor substrate 101. Wiring grooves 104 are then formed inside the layer stack of the interlayer insulating film 102 and the inter-wire insulating film 103. Then, as shown in FIG. 10B, a barrier film 105 and a Cu film 106 are deposited on a surface of the inter-wire insulating film 103 and inside the wiring grooves 104. Parts of the barrier film 105 and the Cu film 106 which stick out from the wiring grooves 104 are then removed by CMP to form lower wires 107. Then, as shown in FIG. 10C, the liner film 121 is deposited about 15 nm in thickness on the surfaces of the inter-wire insulating film 103 and the lower wires 107.

Figure 10E:
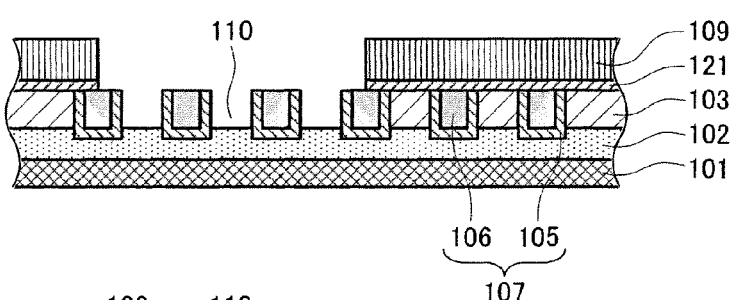
FIG. 10E is a sectional view illustrating a step of the method of manufacturing the semiconductor device according to the fourth embodiment.

Subsequently, as shown in FIG. 10D, the resist pattern 109 is formed on the surface of the liner film 121. Then, as shown in FIG. 10E, the liner film is etched through the resist pattern 109 as a mask. Moreover, the interlayer insulating film 102 and the inter-wire insulating film 103 are partly etched through the resist pattern 109 as a mask to form gaps 110 between the lower wires 107.

Figure 10F:
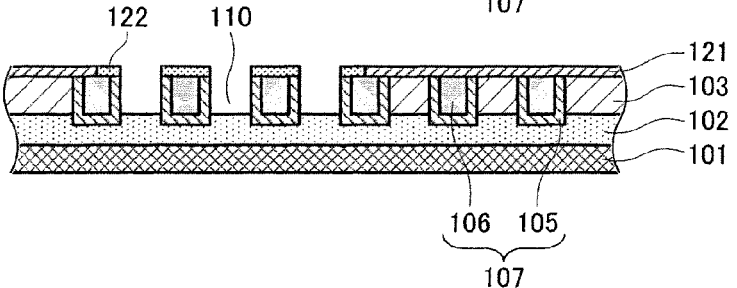
FIG. 10F is a sectional view illustrating a step of the method of manufacturing the semiconductor device according to the fourth embodiment.

Then, as shown in FIG. 10F, the resist pattern 109 is removed, and a cap film 122 is selectively grown on a surface of the Cu film 106 exposed from the liner film 121. In the present embodiment, a CoWP film of about 15 nm in thickness is used as the cap film 122.

Figure 11A:
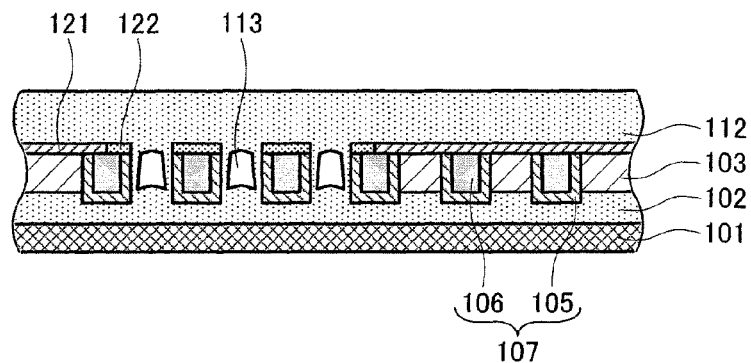
FIG. 11A is a sectional view illustrating a step of the method of manufacturing the semiconductor device according to the fourth embodiment.

Then, as shown in FIG. 11A, an interlayer insulating film 112 is deposited on the surfaces of the liner film 121 and the cap film 122. Thus, the top of the gaps 110 is closed by the interlayer insulating film 112 to form air gaps 113 between the lower wires 107.

Figure 11B:
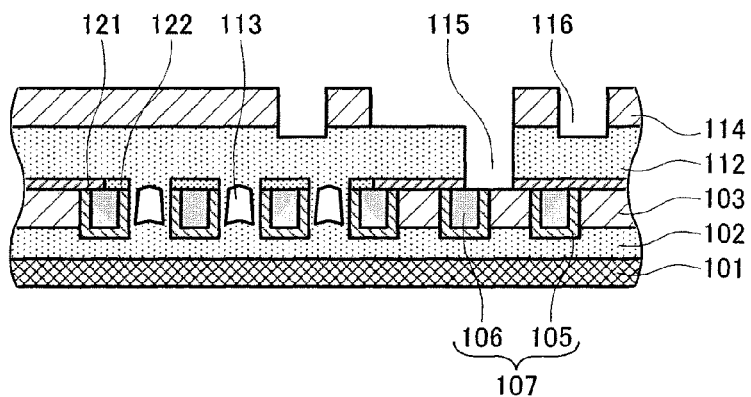
FIG. 11B is a sectional view illustrating a step of the method of manufacturing the semiconductor device according to the fourth embodiment.
Figure 11C:
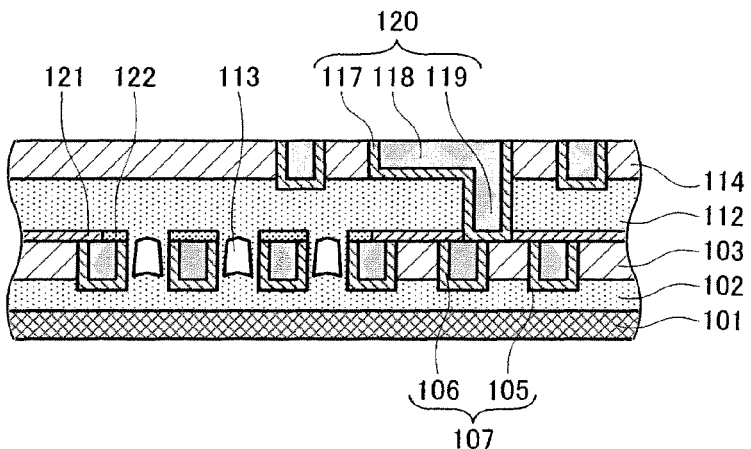
FIG. 11C is a sectional view illustrating a step of the method of manufacturing the semiconductor device according to the fourth embodiment.

Then, as shown in FIG. 11B, an inter-wire insulating film 114 is deposited on a surface of the interlayer insulating film 112. A via hole 115 and a wiring groove 116 are formed inside the liner film 121, the interlayer insulating film 112, and the inter-wire insulating film 114 by lithography and dry etching. Finally, as shown in FIG. 11C, a barrier film 117 and a Cu film 118 are deposited on a surface of the inter-wire insulating film 114 and inside the via hole 115 and the wiring groove 116. Parts of the barrier film 117 and the Cu film 118 which stick out from the wiring grooves 116 are then removed by CMP to form a via 119 and an upper wire 120.

The completed semiconductor device is structurally characterized in that:

(1) the air gaps are each formed in a part of the area between the wires, (2) the lower wires in the air gap non-forming area, which are located away from the air gaps, are coated not with the cap film but with the liner film, and (3) the lower wires in the air gap forming area, which are located close to the air gaps, are coated not with the liner film but with the cap film.

Thus, even when the liner film is removed from the wire located adjacent to the air gap, since the cap film is formed on the exposed Cu film to have an appropriate thickness, it is possible to sufficiently reduce the capacity between the wires and to improve the yield and reliability. Moreover, the periphery of the via is coated with the liner film, which can be used as an etching stopper for etching performed to form the via hole. Moreover, the liner film also serves as a barrier to allow the cap film to be thinned. Furthermore, if the liner film is used to thin the cap film, more cap films can be stacked so as to serve as an appropriate barrier.

In the present embodiment, a film obtained by stacking SiCN and SiCO in this order is used as the liner film 121. However, instead of this film, it is possible to use a single layer film or a film stack of an SiC-containing material such as SiC, SiCO, SiCN, or SiC or an SiN-containing material such as SiN or SiON.

Furthermore, in the present embodiment, a CoWP film is used as the cap film 122. However, instead of the CoWP film, any other film that can grow selectively on the surfaces of the lower wires 107 can be used, for example, a Co film, a Co alloy film, an Ni film, an Ni alloy film, a W film, a W alloy film, or a Cu alloy film.

Figure 11D:
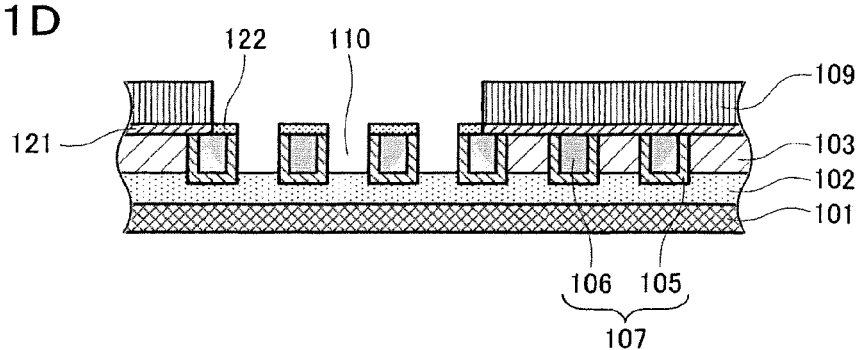
FIG. 11D is a sectional view illustrating a step of the method of manufacturing the semiconductor device according to the fourth embodiment.

In the above description, after the resist pattern 109 is removed, the cap film 122 is selectively grown on the surfaces of the lower wires 107. However, as shown in FIG. 11D, the cap film 122 may be selectively grown on the surfaces of the lower wires 107 before the resist pattern 109 is removed. Subsequently, the resist pattern 109 is removed, and the resulting condition is similar to that shown in FIG. 10F. Such steps as shown in FIGS. 11A, 11B, and 11C are then carried out to complete such a semiconductor device as shown in FIG. 11C.

Fifth Embodiment

A fifth embodiment of the present invention will be described below with reference to FIGS. 12A, 12B, 12C, 12D, 12E, 12F, 13A, 13B, and 13C. FIGS. 12A, 12B, 12C, 12D, 12E, 12F, 13A, 13B, and 13C are sectional views illustrating steps of a method of manufacturing a semiconductor device according to the fifth embodiment.

Figure 12A:
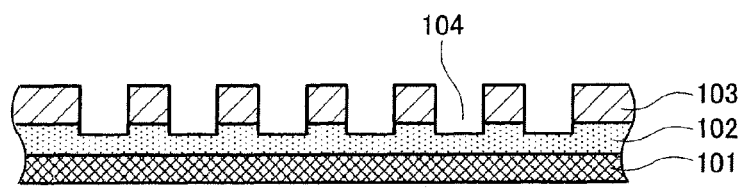
FIG. 12A is a sectional view illustrating a step of a method of manufacturing a semiconductor device according to a fifth embodiment.

The present embodiment is different from the fourth embodiment in that a wetting film 123 is deposited on a surface of a liner film 121 as shown in FIG. 12A. The reason for the deposition of the wetting film 123 is as described below. If a plating method is used to form a cap film 122, a surface of an insulating film which contacts a plating solution is desirably hydrophilic. This is because if the surface of the insulating film is hydrophobic, the wettability of the plating solution is degraded, resulting in the formation of areas on the wires in which the cap film 122 has a thin film thickness or no cap film 122 is formed. Thus, in the present embodiment, the hydrophilic wetting film 123 is deposited on the surface of the hydrophobic liner film 121 to improve the wettability of the plating solution. Thus, the plating solution is in direct contact not with the surface of the hydrophobic liner film 121 but with a surface of the hydrophilic wetting film 123. The wettability of the plating solution can thus be improved. In the present embodiment, an $SiO_2$ film having more hydrophilic bases than the liner film is used as the wetting film 123.

Figure 12B:
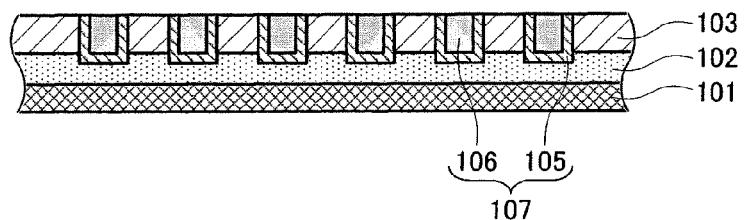
FIG. 12B is a sectional view illustrating a step of the method of manufacturing the semiconductor device according to the fifth embodiment.
Figure 12C:
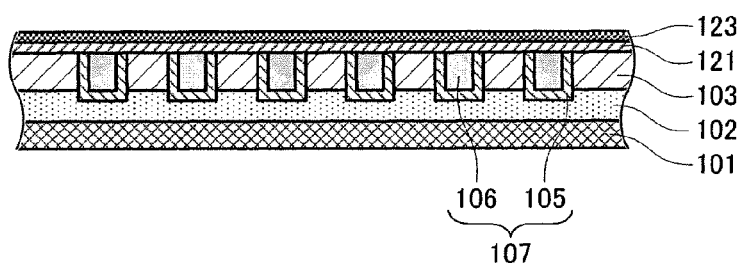
FIG. 12C is a sectional view illustrating a step of the method of manufacturing the semiconductor device according to the fifth embodiment.

First, as shown in FIG. 12A, an interlayer insulating film 102 and an inter-wire insulating film 103 are deposited on a surface of a semiconductor substrate 101. Wiring grooves 104 are then formed inside the layer stack of the interlayer insulating film 102 and the inter-wire insulating film 103. Then, as shown in FIG. 12B, a barrier film 105 and a Cu film 106 are deposited on a surface of the inter-wire insulating film 103 and inside the wiring grooves 104. Parts of the barrier film 105 and the Cu film 106 which stick out from the wiring grooves 104 are removed by CMP to form lower wires 107. Then, as shown in FIG. 12C, on the surfaces of the inter-wire insulating film 103 and the lower wires 107, the liner film 121 is deposited about 15 nm in thickness, and the wetting film 123 is deposited 10 nm in thickness.

Figure 12D:
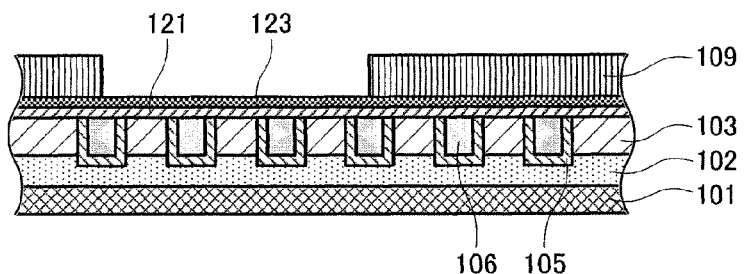
FIG. 12D is a sectional view illustrating a step of the method of manufacturing the semiconductor device according to the fifth embodiment.
Figure 12E:
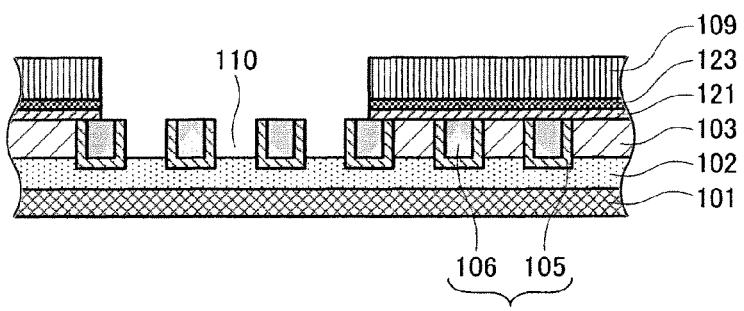
FIG. 12E is a sectional view illustrating a step of the method of manufacturing the semiconductor device according to the fifth embodiment.

Subsequently, as shown in FIG. 12D, a resist pattern 109 is formed on the surface of the wetting film 123 by lithography. Then, as shown in FIG. 12E, the wetting film 123 and the liner film 121 are etched through the resist pattern 109 as a mask. Moreover, the interlayer insulating film 102 and the inter-wire insulating film 103 are partly etched through the resist pattern 109 as a mask to form gaps 110 between the lower wires 107.

Figure 12F:
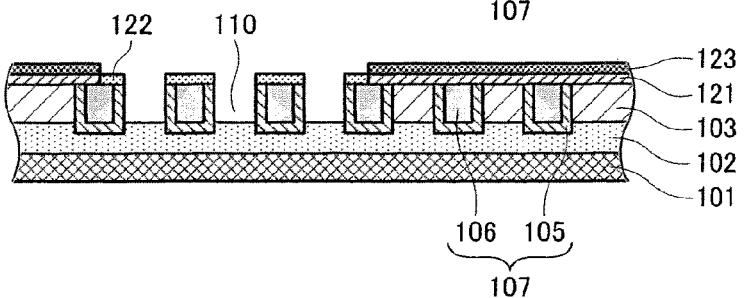
FIG. 12F is a sectional view illustrating a step of the method of manufacturing the semiconductor device according to the fifth embodiment.

Then, as shown in FIG. 12F, the resist pattern 109 is removed, and the cap film 122 is selectively grown on a surface of the Cu film 106 exposed from the liner film 121. In the present embodiment, a CoWP film of about 15 nm in thickness is used as the cap film 122.

Figure 13A:
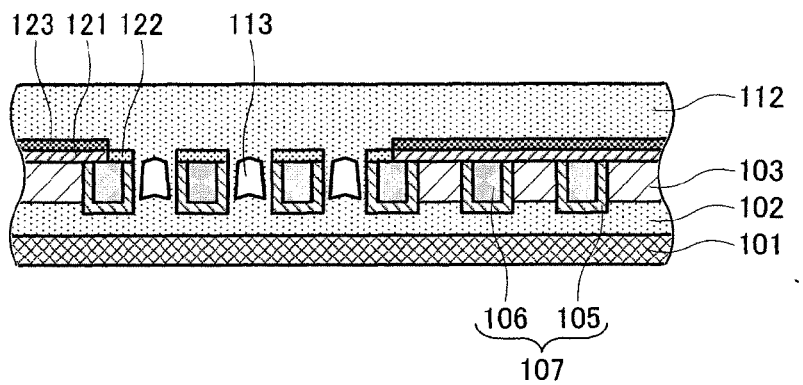
FIG. 13A is a sectional view illustrating a step of the method of manufacturing the semiconductor device according to the fifth embodiment.

Then, as shown in FIG. 13A, an interlayer insulating film 112 is deposited on the surfaces of the liner film 121 and the cap film 122. Thus, the top of the gaps 110 is closed by the interlayer insulating film 112 to form air gaps 113 between the lower wires 107.

Figure 13B:
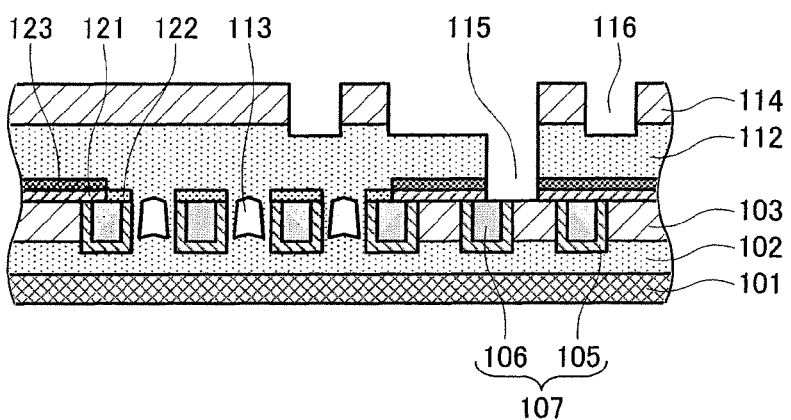
FIG. 13B is a sectional view illustrating a step of the method of manufacturing the semiconductor device according to the fifth embodiment.
Figure 13C:
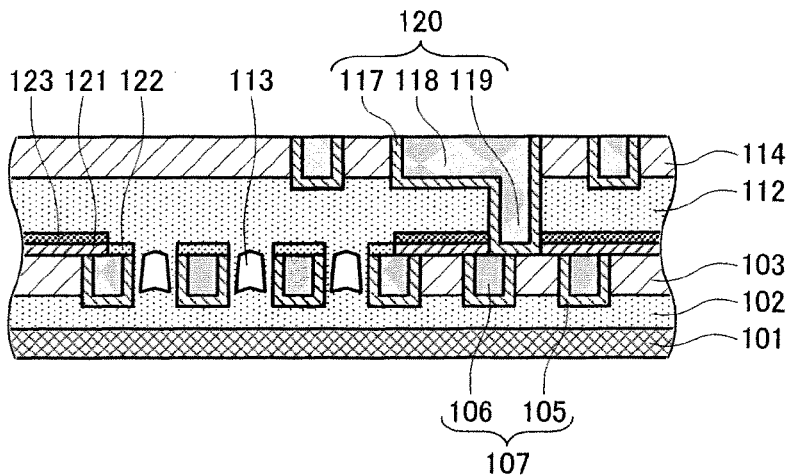
FIG. 13C is a sectional view illustrating a step of the method of manufacturing the semiconductor device according to the fifth embodiment.

Then, as shown in FIG. 13B, an inter-wire insulating film 114 is deposited on a surface of the interlayer insulating film 112. A via hole 115 and a wiring groove 116 are formed inside the liner film 121, the interlayer insulating film 112, and the inter-wire insulating film 114 by lithography and dry etching. Finally, as shown in FIG. 13C, a barrier film 117 and a Cu film 118 are deposited on a surface of the inter-wire insulating film 114 and inside the via hole 115 and the wiring groove 116. Parts of the barrier film 117 and the Cu film 118 which stick out from the wiring grooves 116 are removed by CMP to form a via 119 and an upper wire 120.

In the semiconductor device completed thus, the wetting film is formed on the liner film. This is effective for reliably forming the cap film on the surfaces of the wires.

The present embodiment corresponds to the fourth embodiment improved by depositing the wetting film 123 on the surface of the liner film 121. This improvement can similarly be made to the third embodiment. That is, in FIG. 12C, the cap film may be formed on the surfaces of the lower wires 107 before the liner film 121 is deposited on the surfaces of the lower wires 107. This structure enables the cap film to be reliably formed on the wire surfaces. The present embodiment is thus effective for sufficiently reducing the capacity between the wires and improving the yield and reliability.

In the present embodiment, a film obtained by stacking SiCN and SiCO in this order is used as the liner film 121. However, instead of this film, it is possible to use a single layer film or a film stack of an SiC-containing material such as SiC, SiCO, SiCN, or SiC or an SiN-containing material such as SiN or SiON.

Furthermore, in the present embodiment, a CoWP film is used as the cap film 122. However, instead of the CoWP film, any other film that can grow selectively on the surfaces of the lower wires 107 can be used, for example, a Co film, a Co alloy film, an Ni film, an Ni alloy film, a W film, a W alloy film, or a Cu alloy film.

Sixth Embodiment

A sixth embodiment of the present invention will be described below with reference to FIGS. 14A, 14B, 14C, 14D, 14E, 14F, 15A, 15B, and 15C. FIGS. 14A, 14B, 14C, 14D, 14E, 14F, 15A, 15B, and 15C are sectional views illustrating steps of a method of manufacturing a semiconductor device according to the sixth embodiment. Only the differences of the present embodiment from the second embodiment will be described. The description of parts similar to those in the second embodiment is omitted.

Figure 14A:
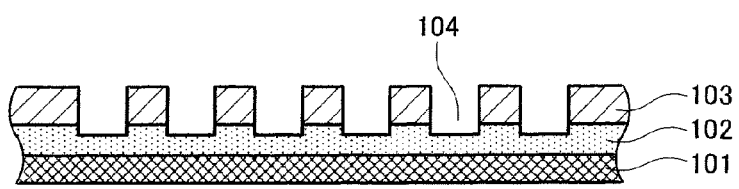
FIG. 14A is a sectional view illustrating a step of a method of manufacturing a semiconductor device according to a sixth embodiment.
Figure 14B:
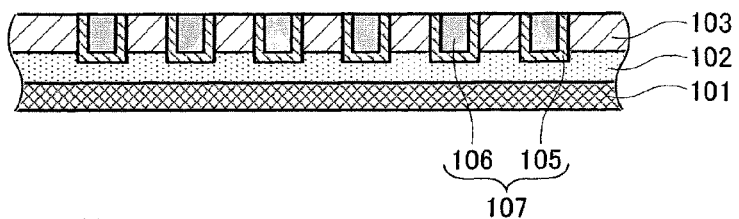
FIG. 14B is a sectional view illustrating a step of the method of manufacturing the semiconductor device according to the sixth embodiment.
Figure 14C:
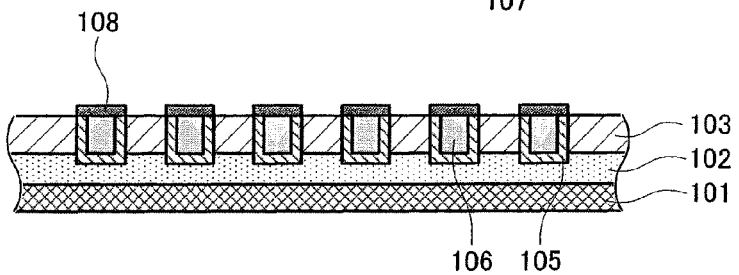
FIG. 14C is a sectional view illustrating a step of the method of manufacturing the semiconductor device according to the sixth embodiment.
Figure 14D:
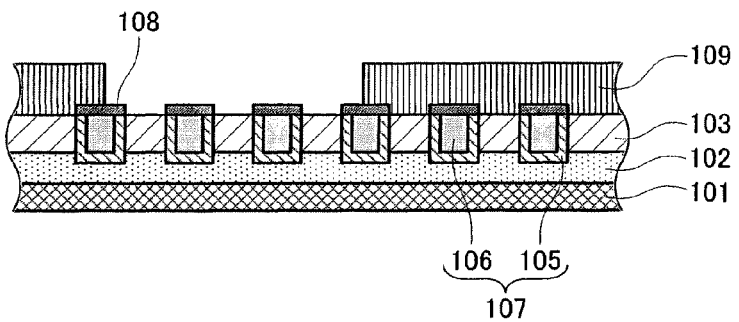
FIG. 14D is a sectional view illustrating a step of the method of manufacturing the semiconductor device according to the sixth embodiment.
Figure 14E:
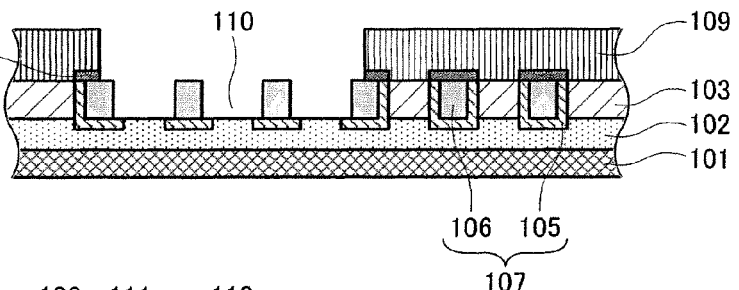
FIG. 14E is a sectional view illustrating a step of the method of manufacturing the semiconductor device according to the sixth embodiment.
Figure 14F:
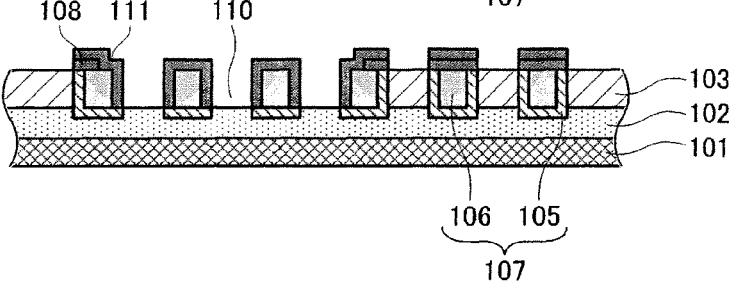
FIG. 14F is a sectional view illustrating a step of the method of manufacturing the semiconductor device according to the sixth embodiment.

The present embodiment is different from the second embodiment in that as shown in FIG. 14E, simultaneously with the formation of gaps 110 between lower wires 107 by the partial etching of an interlayer insulating film 102 and an inter-wire insulating film 103 through a resist pattern 109 as a mask, a first cap film 108 and a barrier film 105 are partly pruned away. Then, as shown in FIG. 14F, the resist pattern 109 is removed, and a second cap film 111 is selectively grown on surfaces of an exposed Cu film 106 and first cap film 108. This increases the coverage of the Cu film 106 with the cap film, thus making it possible to improve the resistance of the lower wires 107 to electromigration (EM) and stress migration (SM). The reason why the resistance to EM and SM is improved by replacing the barrier film 105 with the second cap film 111 is as described below. The barrier film 105 is normally deposited by sputtering. Since the sputtering is a highly directional film forming method, a part of the barrier film 105 deposited on a side surface of a wiring groove 104 is thinner than a part of the barrier film 105 deposited on a bottom surface of the wiring groove 104. When the barrier film 105 is thinned in response to the recent miniaturization of semiconductor devices, the part of the barrier film 105 deposited on the side surface of the wiring groove 104 becomes extremely thin. The continuity of the film is thus degraded to create a path along which Cu atoms diffuse at a high speed. Thus, the barrier film 105 is once removed and replaced with the second cap film 111 having a high coverage, to improve the resistance to EM and SM.

First, as shown in FIG. 14A, the interlayer insulating film 102 and the inter-wire insulating film 103 are deposited on a surface of a semiconductor substrate 101. The wiring grooves 104 are then formed inside the layer stack of the interlayer insulating film 102 and the inter-wire insulating film 103.

Then, as shown in FIG. 14B, the barrier film 105 and the Cu film 106 are deposited on a surface of the inter-wire insulating film 103 and inside the wiring grooves 104. Parts of the barrier film 105 and the Cu film 106 which stick out from the wiring grooves 104 are removed by CMP to form the lower wires 107.

Then, as shown in FIG. 14C, the first cap film 108 is selectively grown on the surface of the Cu film 106.

Then, as shown in FIG. 14D, the resist pattern 109 is formed on the surfaces of the inter-wire insulating film 103 and the first cap film 108 by lithography.

Then, as shown in FIG. 14E, the interlayer insulating film 102 and the inter-wire insulating film 103 are partly etched through the resist pattern 109 as a mask to form the gaps 110 between the lower wires 107. In this case, etching conditions are adjusted so as to simultaneously prune away part of the first cap film 108 and the barrier film 105.

Then, as shown in FIG. 14F, the resist pattern 109 is removed, and the second cap film 111 is selectively grown on the surfaces of the Cu film 106 and the first cap film 108.

Figure 15A:
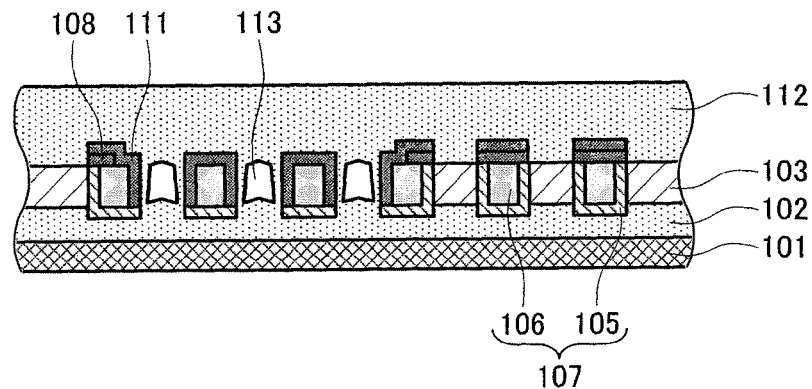
FIG. 15A is a sectional view illustrating a step of the method of manufacturing the semiconductor device according to the sixth embodiment.

Then, as shown in FIG. 15A, an interlayer insulating film 112 is deposited on the surfaces of the inter-wire insulating film 103 and the second cap film 111. Thus, the top of the gaps 110 is closed by the interlayer insulating film 112 to form air gaps 113 between the lower wires 107.

Figure 15B:
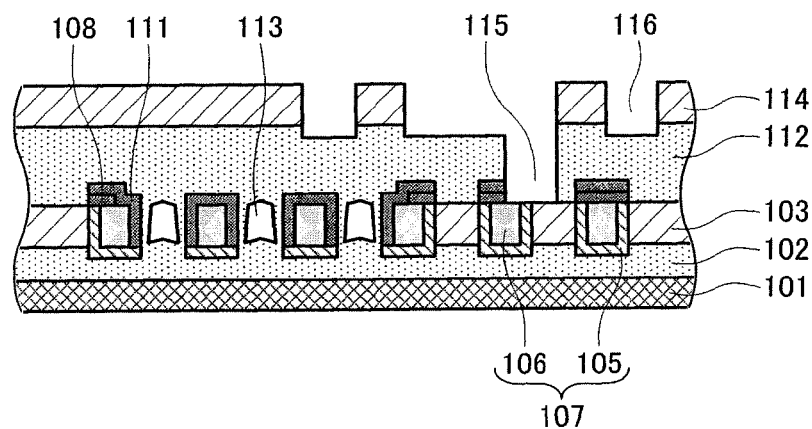
FIG. 15B is a sectional view illustrating a step of the method of manufacturing the semiconductor device according to the sixth embodiment.

Then, as shown in FIG. 15B, an inter-wire insulating film 114 is deposited on a surface of the interlayer insulating film 112. A via hole 115 and a wiring groove 116 are formed inside the layer stack of the interlayer insulating film 112 and the inter-wire insulating film 114 by lithography and dry etching.

Figure 15C:
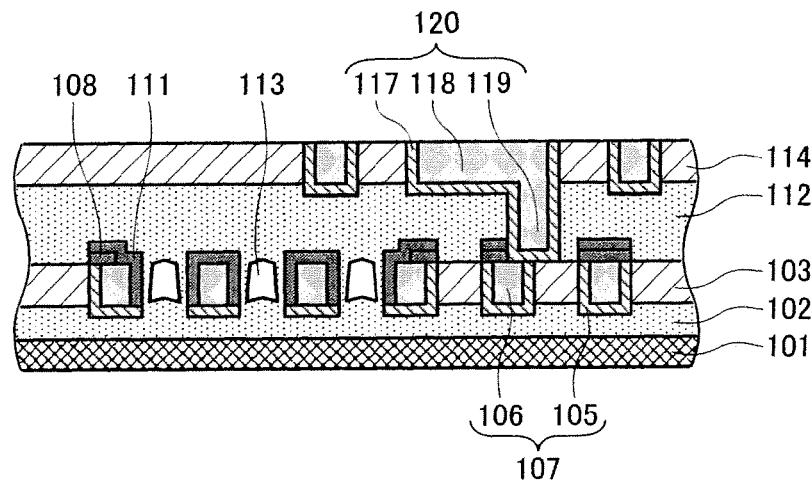
FIG. 15C is a sectional view illustrating a step of the method of manufacturing the semiconductor device according to the sixth embodiment.
Figure 16A:
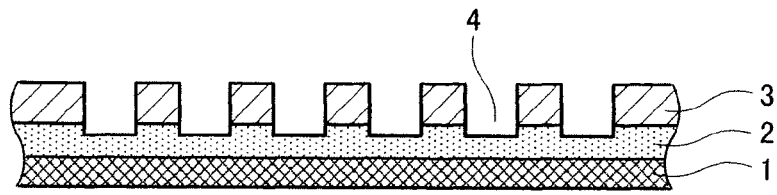
FIG. 16A is a sectional view illustrating a step of a conventional method of manufacturing a semiconductor device.
Figure 16B:
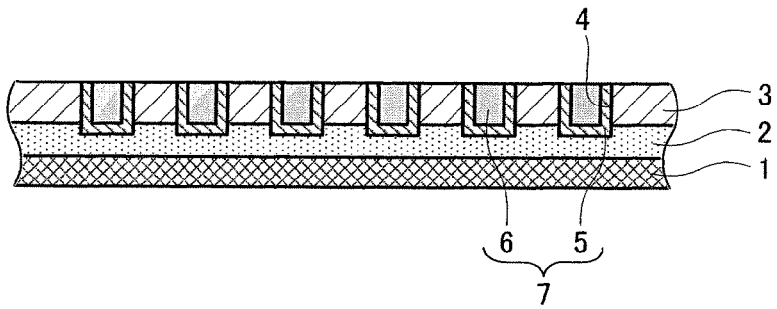
FIG. 16B is a sectional view illustrating a step of the conventional method of manufacturing the semiconductor device.
Figure 16C:
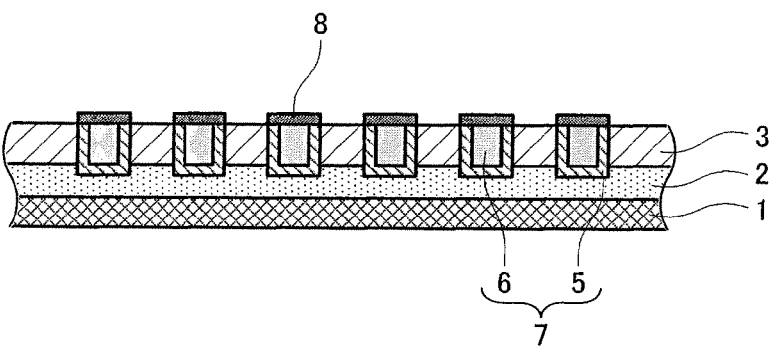
FIG. 16C is a sectional view illustrating a step of the conventional method of manufacturing the semiconductor device.
Figure 16D:
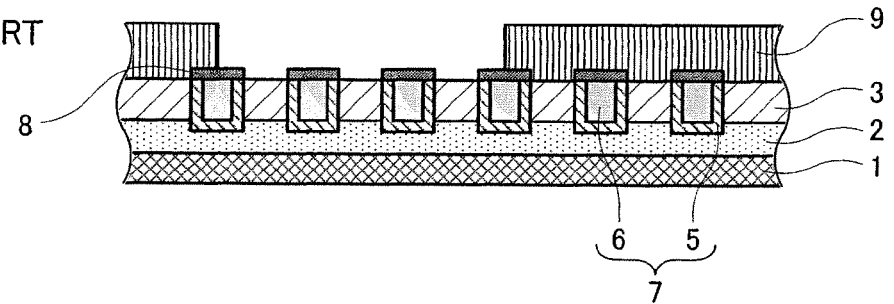
FIG. 16D is a sectional view illustrating a step of the conventional method of manufacturing the semiconductor device.
Figure 16E:
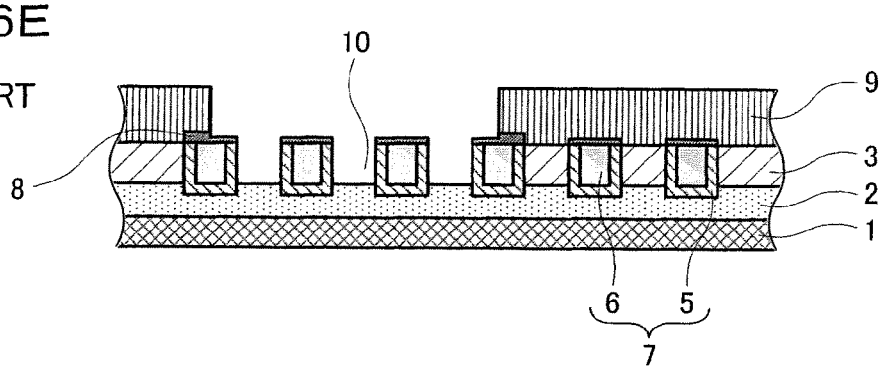
FIG. 16E is a sectional view illustrating a step of the conventional method of manufacturing the semiconductor device.
Figure 17A:
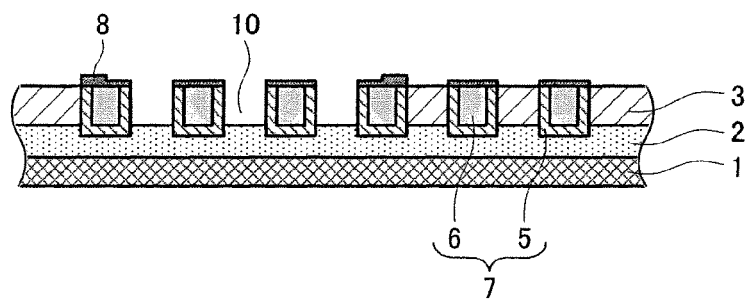
FIG. 17A is a sectional view illustrating a step of the conventional method of manufacturing the semiconductor device.
Figure 17B:
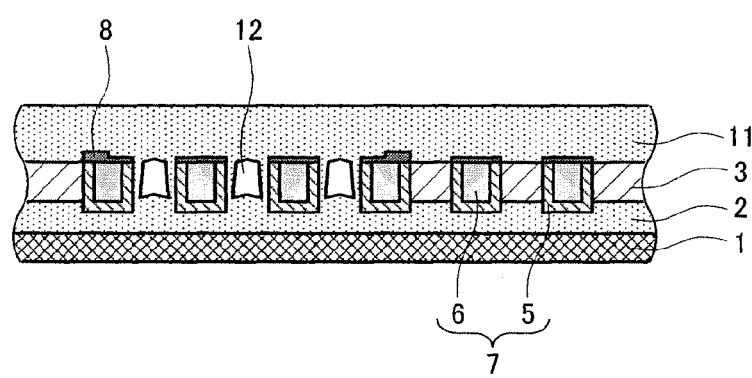
FIG. 17B is a sectional view illustrating a step of the conventional method of manufacturing the semiconductor device.
Figure 17C:
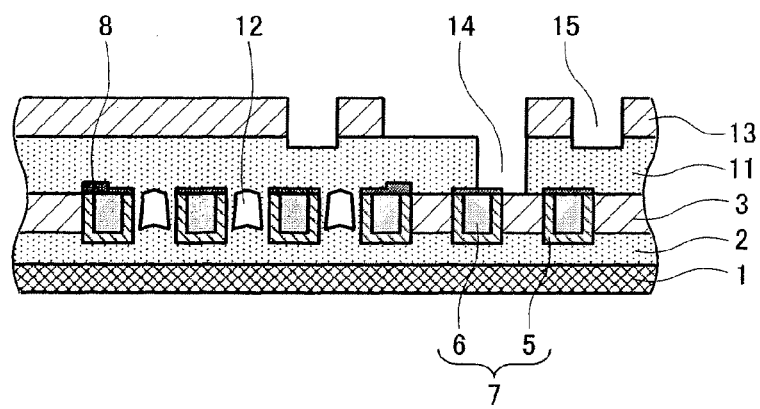
FIG. 17C is a sectional view illustrating a step of the conventional method of manufacturing the semiconductor device.
Figure 17D:
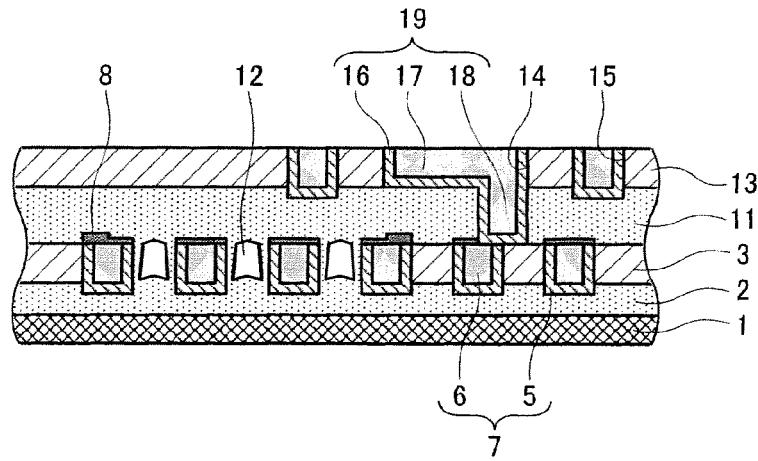
FIG. 17D is a sectional view illustrating a step of the conventional method of manufacturing the semiconductor device.

Finally, as shown in FIG. 15C, a barrier film 117 and a Cu film 118 are deposited on a surface of the inter-wire insulating film 114 and inside the via hole 115 and the wiring groove 116. Parts of the barrier film 117 and the Cu film 118 which stick out from the wiring grooves 116 are removed by CMP to form a via 119 and an upper wire 120.

The semiconductor device completed thus increases the coverage of the Cu film 106 with the cap film to improve the resistance of the lower wires 107 to electromigration (EM) or stress migration (SM).

In the present embodiment, provided that a cap metal film is selectively grown on the surface of the Cu film 106 during the step of forming the cross section shown in FIG. 14F, the first cap film 108 need not be selectively grown on the surface of the Cu film 106 during the step of forming the cross section shown in FIG. 14C. This formation method makes it possible to sufficiently improve the resistance of the lower wires 107 to electromigration (EM) or stress migration (SM). However, it is a matter of course that more positive effects are expected when the first cap film 108 is selectively grown on the surface of the Cu film 106 than when the first cap film 108 is not selectively grown on the surface of the Cu film 106.

In the present embodiment, a CoWP film is used as the cap film 122. However, instead of the CoWP film, any other film that can grow selectively on the surfaces of the lower wires 107 can be used, for example, a Co film, a Co alloy film, an Ni film, an Ni alloy film, a W film, a W alloy film, or a Cu alloy film.

The best mode for carrying out the present invention has been described with reference to the six embodiments. However, the present invention is not limited to these embodiments. For example, in the above-described embodiments, the air gaps are each formed between the wires formed by a single damascene method, and the via and the wire are formed over the air gaps by a dual damascene method. However, the air gaps may each be formed between the wires formed by the dual damascene method. Furthermore, in the above-described embodiments, the resist pattern is used as a mask to control the areas in which the air gaps are formed. However, a material other than the resist, for example, an insulating film, can also be used as a mask. In the above-described embodiments, a Cu film is used as a component of the wires. However, instead of the Cu film, any other film offering a low electric resistance can be used, for example, a copper alloy film, a silver film, a gold film, a tungsten film, or an aluminum film. Furthermore, in the above-described embodiments, an $SiO_2$ film or an SiOC film is used as the interlayer insulating film or the inter-wire insulating film. However, instead of the $SiO_2$ film or SiOC film, any other film that can insulate the wires from each other can be used, for example, an SiOF film, a BCB film, or a SILK film. Many other variations may be made to the above-described embodiments without departing from the spirit of the present invention.

What is claimed is:

1. A method of manufacturing a semiconductor device having at least one wiring layer therein and an air gap in any wiring layer area to reduce inter-wire capacity, the method comprising:
when forming the wiring layer in which an air gap is formed,
forming a first insulating film on a semiconductor substrate or a lower wiring layer;
forming a plurality of wires in an upper part of the first insulating film;
forming a first cap film on the wires;
forming a mask pattern on an air gap non-forming area of the first insulating film and the first cap film;
at least partly etching the first cap film and the first insulating film through the mask pattern to form a gap in an air gap forming area;
removing the mask pattern;
forming a second cap film on at least an area in which the first cap film was etched; and
depositing a second insulating film on the gap, the first cap film, and the second cap film to form the air gap from the gap in the air gap forming area.

2. The method of manufacturing the semiconductor device according to claim 1, wherein the wires comprise a copper film or a copper alloy film.

3. The method of manufacturing the semiconductor device according to claim 1, wherein each of the first cap film and the second cap film is any of a Co film, a Co alloy film, an Ni film, an Ni alloy film, a W film, a W alloy film, and a Cu alloy film.

4. The method of manufacturing the semiconductor device according to claim 1, wherein the first insulating film is any of an SiO.sub.2 film, an SiOC film, an SiOF film, a BCB film, and an SiLK film.

5. A method of manufacturing a semiconductor device having at least one wiring layer therein and an air gap in any wiring layer area to reduce inter-wire capacity, the method comprising:
when forming the wiring layer in which an air gap is formed,
forming a first insulating film on a semiconductor substrate or a lower wiring layer;
forming a plurality of wires in an upper part of the first insulating film;
forming a first cap film on the wires;
forming a mask pattern on an air gap non-forming area of the first insulating film and the first cap film;
etching entirely away the first cap film through the mask pattern to form a gap in an air gap forming area;
removing the mask pattern;
forming a second cap film on the wiring layer in at least an area in the air gap forming area in which the first cap film was etched entirely away; and
depositing a second insulating film on the gap, and the second cap film to form the air gap.

6. The method of manufacturing the semiconductor device according to claim 5, wherein the wires comprise a copper film or a copper alloy film.

7. The method of manufacturing the semiconductor device according to claim 5, wherein the second cap film is any of a Co film, a Co alloy film, an Ni film, an Ni alloy film, a W film, a W alloy film, and a Cu alloy film.

8. The method of manufacturing the semiconductor device according to claim 5, wherein the first insulating film is any of an SiO.sub.2 film, an SiOC film, an SiOF film, a BCB film, and an SiLK film.

* * * * *